United States Patent
Lim et al.

(10) Patent No.: US 11,417,264 B2
(45) Date of Patent: Aug. 16, 2022

(54) SCAN DRIVER

(71) Applicant: SAMSUNG DISPLAY CO., LTD., Yongin-si (KR)

(72) Inventors: Jae Keun Lim, Yongin-si (KR); Jin Young Roh, Yongin-si (KR); Se Hyuk Park, Yongin-si (KR); Hyo Jin Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/320,372

(22) Filed: May 14, 2021

(65) Prior Publication Data

US 2022/0101774 A1 Mar. 31, 2022

(30) Foreign Application Priority Data

Sep. 29, 2020 (KR) .................. 10-2020-0127493

(51) Int. Cl.
*G09G 3/20* (2006.01)

(52) U.S. Cl.
CPC ... *G09G 3/2092* (2013.01); *G09G 2300/0426* (2013.01); *G09G 2310/0267* (2013.01)

(58) Field of Classification Search
CPC ... G09G 2310/0286; G09G 2310/0267; G09G 3/20; G09G 2310/0264; G09G 2310/0283
See application file for complete search history.

(56) References Cited

U.S. PATENT DOCUMENTS

| | | | |
|---|---|---|---|
| 8,669,969 B2 | 3/2014 | Chung | |
| 9,437,168 B2 | 9/2016 | Her | |
| 2011/0273417 A1* | 11/2011 | Shin | G09G 3/20 345/211 |
| 2015/0077407 A1* | 3/2015 | Kim | G09G 3/3611 345/204 |
| 2017/0084222 A1* | 3/2017 | Sun | G09G 3/32 |
| 2018/0182300 A1* | 6/2018 | Chen | G11C 19/28 |
| 2018/0240382 A1* | 8/2018 | Choi | G09G 3/3696 |
| 2019/0035322 A1* | 1/2019 | Kim | H01L 27/1251 |
| 2019/0043405 A1* | 2/2019 | Noh | G09G 3/20 |

FOREIGN PATENT DOCUMENTS

| | | |
|---|---|---|
| KR | 10-1084182 | 11/2011 |
| KR | 10-1319356 | 10/2013 |
| KR | 10-2015-0136669 | 12/2015 |

* cited by examiner

*Primary Examiner* — Hong Zhou
(74) *Attorney, Agent, or Firm* — F. Chau & Associates, LLC

(57) ABSTRACT

A scan driver stage including: a first transistor including a gate connected to a first clock, a first electrode connected to a carry terminal, and a second electrode connected to a first node; a second transistor including a gate connected to a second clock, a first electrode connected to a carry terminal, and a second electrode connected to the first node; a third transistor including a gate connected to the first node and a first electrode connected to a second node; a fourth transistor including a gate connected to the second clock, a first electrode connected to power, and a second electrode connected to the second node; a fifth transistor including a gate connected to the first clock, a first electrode connected to power, and a second electrode connected to the second node; and an output outputting first and second scan signals based on first and second node voltages.

20 Claims, 16 Drawing Sheets

SCAN DRIVER

CROSS-REFERENCE TO RELATED APPLICATION

This application claims priority under 35 U.S.C. 119 to Korean Patent Application No. 10-2020-0127493 filed in the Korean Intellectual Property Office on Sep. 29, 2020, the disclosure of which is incorporated by reference herein in its entirety.

(a) Technical Field

The present invention relates to a scan driver.

(b) Description of the Related Art

As information technology has developed, a display device is increasingly being used as a connection medium between a user and information. Examples of such display devices include a liquid crystal display device, an organic light emitting display device, etc.

A display device displays an image with a light emitting combination based on data voltages written to pixels. A scan driver is used to select the pixels to which the data voltages are written. When there are many elements in a scan driver, a dead space in which an image is not displayed may increase.

SUMMARY

An embodiment of the present invention provides a scan driver including: a plurality of stages, wherein a first stage of the plurality of stages includes: a first transistor including a gate electrode connected to a first clock terminal, a first electrode connected to a first carry terminal, and a second electrode connected to a first node; a second transistor including a gate electrode connected to a second clock terminal, a first electrode connected to a second carry terminal, and a second electrode connected to the first node; a third transistor including a gate electrode connected to the first node and a first electrode connected to a second node; a fourth transistor including a gate electrode connected to the second clock terminal, a first electrode connected to a first power terminal, and a second electrode connected to the second node; a fifth transistor including a gate electrode connected to the first clock terminal, a first electrode connected to the first power terminal, and a second electrode connected to the second node; and an output portion configured to output a first scan signal to a first output terminal and a second scan signal to a second output terminal, based on a voltage of the first node and a voltage of the second node.

The output portion may include: a sixth transistor including a gate electrode connected to the second node, a first electrode connected to the first output terminal, and a second electrode connected to a second power terminal; a seventh transistor including a gate electrode connected to a third node, a first electrode connected to a third clock terminal, and a second electrode connected to the first output terminal; and a first capacitor including a first electrode connected to the third node and a second electrode connected to the first output terminal.

The output portion may further include: an eighth transistor including a gate electrode connected to the second node, a first electrode connected to the second output terminal, and a second electrode connected to the second power terminal; a ninth transistor including a gate electrode connected to a fourth node, a first electrode connected to a fourth clock terminal, and a second electrode connected to the second output terminal; and a second capacitor including a first electrode connected to the fourth node and a second electrode connected to the second output terminal.

The output portion may further include: a third capacitor including a first electrode connected to the second node and a second electrode connected to the second power terminal; a tenth transistor including a gate electrode connected to the first power terminal, a first electrode connected to the first node, and a second electrode connected to the third node; and an eleventh transistor including a gate electrode connected to the first power terminal, a first electrode connected to the first node, and a second electrode connected to the fourth node.

The second electrode of the third transistor may be connected to the second power terminal.

The second electrode of the third transistor may be connected to the second clock terminal.

The first stage may further include a twelfth transistor including a gate electrode connected to the first node, a first electrode connected to the first clock terminal, and a second electrode connected to the second node.

In a second stage of the plurality of stages, a first carry terminal may be connected to the second output terminal of the first stage, a second carry terminal may be connected to the first output terminal of the first stage, a first clock terminal may be connected to the fourth clock terminal of the first stage, a second clock terminal may be connected to the third clock terminal of the first stage, a third clock terminal may be connected to the second clock terminal of the first stage, and a fourth clock terminal may be connected to the first clock terminal of the first stage.

The first carry terminal and the second carry terminal of the first stage may be connected to each other.

A width/length ratio of a channel of the third transistor may be less than or equal to a width/length ratio of a channel of the fourth transistor or the fifth transistor.

An embodiment of the present invention provides a scan driver including: a plurality of stages, wherein a first stage of the plurality of stages includes: a first transistor including a gate electrode connected to a first clock terminal, a first electrode connected to a first carry terminal, and a second electrode connected to a first node; a second transistor including a gate electrode connected to a second clock terminal, a first electrode connected to the first node, and a second electrode connected to a second power terminal; a third transistor including a gate electrode connected to the first node, a first electrode connected to the first clock terminal, and a second electrode connected to a second node; a fourth transistor including a gate electrode connected to the first clock terminal, a first electrode connected to a first power terminal, and a second electrode connected to the second node; and an output portion configured to output a first scan signal to a first output terminal and a second scan signal to a second output terminal, based on a voltage of the first node and a voltage of the second node.

The output portion may include: a fifth transistor including a gate electrode connected to the second node, a first electrode connected to the first output terminal, and a second electrode connected to the second power terminal; a sixth transistor including a gate electrode connected to a third node, a first electrode connected to a third clock terminal, and a second electrode connected to the first output terminal;

and a first capacitor including a first electrode connected to the third node and a second electrode connected to the first output terminal.

The output portion may further include: a seventh transistor including a gate electrode connected to the second node, a first electrode connected to the second output terminal, and a second electrode connected to the second power terminal; an eighth transistor including a gate electrode connected to a fourth node, a first electrode connected to a fourth clock terminal, and a second electrode connected to the second output terminal; and a second capacitor including a first electrode connected to the fourth node and a second electrode connected to the second output terminal.

The output portion may further include: a ninth transistor including a gate electrode connected to the first power terminal, a first electrode connected to the first node, and a second electrode connected to the third node; a tenth transistor including a gate electrode connected to the first power terminal, a first electrode connected to the first node, and a second electrode connected to the fourth node; and a third capacitor including a first electrode connected to the second node and a second electrode connected to the second power terminal.

In a second stage of the plurality of stages, a first carry terminal may be connected to the second output terminal of the first stage, a first clock terminal may be connected to the fourth clock terminal of the first stage, a second clock terminal may be connected to the third clock terminal of the first stage, a third clock terminal may be connected to the second clock terminal of the first stage, and a fourth clock terminal may be connected to the first clock terminal of the first stage.

An embodiment of the present invention provides a scan driver including: a plurality of stages, wherein a first stage of the plurality of stages includes: a first transistor including a gate electrode connected to a first clock terminal, a first electrode connected to a first carry terminal, and a second electrode connected to a first node; a second transistor including a gate electrode connected to a second clock terminal, a first electrode connected to a first power terminal, and a second electrode connected to a second node; a third transistor including a gate electrode connected to the first node, a first electrode connected to the first clock terminal, and a second electrode connected to the second node; a fourth transistor including a gate electrode connected to the first clock terminal, a first electrode connected to the first power terminal, and a second electrode connected to the second node; and an output portion configured to output a first scan signal to a first output terminal and a second scan signal to a second output terminal, based on a voltage of the first node and a voltage of the second node.

The output portion may include: a fifth transistor including a gate electrode connected to the second node, a first electrode connected to the first output terminal, and a second electrode connected to a second power terminal; a sixth transistor including a gate electrode connected to a third node, a first electrode connected to a third clock terminal, and a second electrode connected to the first output terminal; and a first capacitor including a first electrode connected to the third node and a second electrode connected to the first output terminal.

The output portion may further include: a seventh transistor including a gate electrode connected to the second node, a first electrode connected to the second output terminal, and a second electrode connected to the second power terminal; an eighth transistor including a gate electrode connected to a fourth node, a first electrode connected to a fourth clock terminal, and a second electrode connected to the second output terminal; and a second capacitor including a first electrode connected to the fourth node and a second electrode connected to the second output terminal.

The output portion may further include: a ninth transistor including a gate electrode connected to the first power terminal, a first electrode connected to the first node, and a second electrode connected to the third node; a tenth transistor including a gate electrode connected to the first power terminal, a first electrode connected to the first node, and a second electrode connected to the fourth node; and a third capacitor including a first electrode connected to the second node and a second electrode connected to the second power terminal.

In a second stage of the plurality of stages, a first carry terminal may be connected to the second output terminal of the first stage, a first clock terminal may be connected to the fourth clock terminal of the first stage, a second clock terminal may be connected to the third clock terminal of the first stage, a third clock terminal may be connected to the second clock terminal of the first stage, and a fourth clock terminal may be connected to the first clock terminal of the first stage.

An embodiment of the present invention provides a stage for a scan driver including: a first transistor and a fifth transistor that are turned on by a first clock signal, wherein the first transistor is connected to a first node and the fifth transistor is connected to second node; a second transistor and a fourth transistor that are turned on by a second clock signal, wherein the second transistor is connected to the first node and the fourth transistor is connected to the second node; a third transistor connected to the first node and the second node; and an output circuit configured to output a first scan signal to a first output terminal and a second scan signal to a second output terminal, based on a voltage of the first node and a voltage of the second node.

The first transistor and the fifth transistor may be connected to a first clock terminal, and the second transistor and the fourth transistor may be connected to a second clock terminal.

The third transistor may be connected to a second power terminal and the fourth transistor may be connected to a first power terminal.

The output circuit may include a third node disposed between a first pair of transistors connected to a first capacitor, a voltage of the third node may drop below a logic low level when a clock signal applied to a third clock terminal has the logic low level.

The output circuit may further include a fourth node connected between a second pair of transistors, a voltage of the fourth node may drop below the logic low level when a clock signal applied to a fourth clock terminal has the logic low level.

DETAILED DESCRIPTION OF THE EMBODIMENTS

Figure 1:
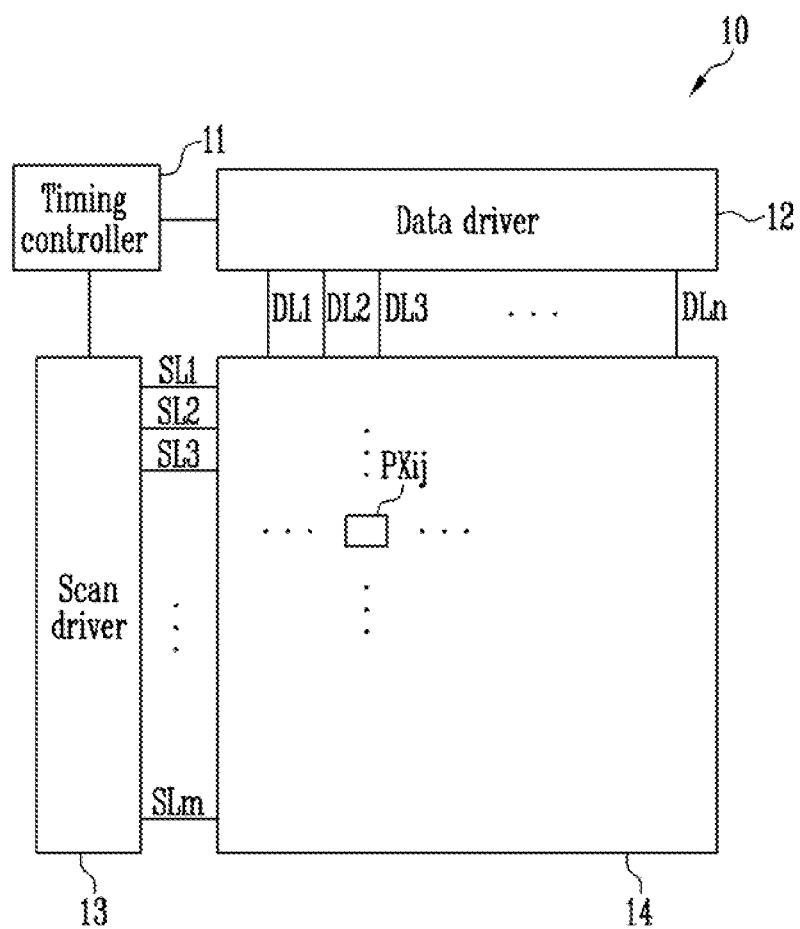
FIG. 1 illustrates a schematic view for explaining a display device according to an embodiment of the present invention.

Embodiments of the present invention will be described more fully hereinafter with reference to the accompanying drawings.

In the specification and drawings, identical or similar elements may be denoted by the same reference numerals.

Further, in the drawings, the thicknesses of layers, films, panels, regions, etc. may be exaggerated for clarity.

FIG. 1 illustrates a schematic view for explaining a display device according to an embodiment of the present invention.

Referring to FIG. 1, a display device 10 according to an embodiment of the present invention may include a timing controller 11, a data driver 12, a scan driver 13, and a pixel portion 14.

The timing controller 11 may receive an external input signal from an external processor. The external input signal may include a vertical synchronization signal, a horizontal synchronization signal, a data enable signal, RGB data, and the like. The vertical synchronization signal may include a plurality of pulses, and may indicate that a previous frame period ends and a current frame period begins based on a time point at which each pulse is generated. An interval between adjacent pulses of the vertical synchronization signal may correspond to one frame period. The horizontal synchronization signal may include a plurality of pulses, and may indicate that a previous horizontal period ends and a new horizontal period begins based on a time point at which each pulse is generated. An interval between adjacent pulses of the horizontal synchronization signal may correspond to one horizontal period. The data enable signal may indicate that the RGB data is supplied in the horizontal period. The RGB data may be supplied in units of pixel rows in the horizontal periods in response to the data enable signal. The RGB data corresponding to one frame may be referred to as one input image. The timing controller 11 may determine consecutive input images as still images when grays of the consecutive input images are substantially the same. The timing controller 11 may determine the continuous input images as moving pictures when the grays of the consecutive input images are substantially different.

The data driver 12 may provide data voltages corresponding to grays of the input images to the pixels. For example, the data driver 12 may sample grays by using a clock signal and apply data voltages corresponding to the grays to data output lines DL1, DL2, DL3, . . . , DLn in units of scan lines. Here, n may be an integer greater than zero.

The scan driver 13 may receive a clock signal, a scan start signal, and the like from the timing controller 11 to generate scan signals to be provided to scan lines SL1, SL2, SL3, . . . , SLm. Here, m may be an integer greater than zero.

The pixel portion 14 includes pixels. Each pixel PXij may be connected to a corresponding data line and scan line. Here, i and j may be integers greater than zero. For example, a pixel PXij may be a pixel in which a scan transistor is connected to an i-th scan line and a j-th data line.

Figure 2:
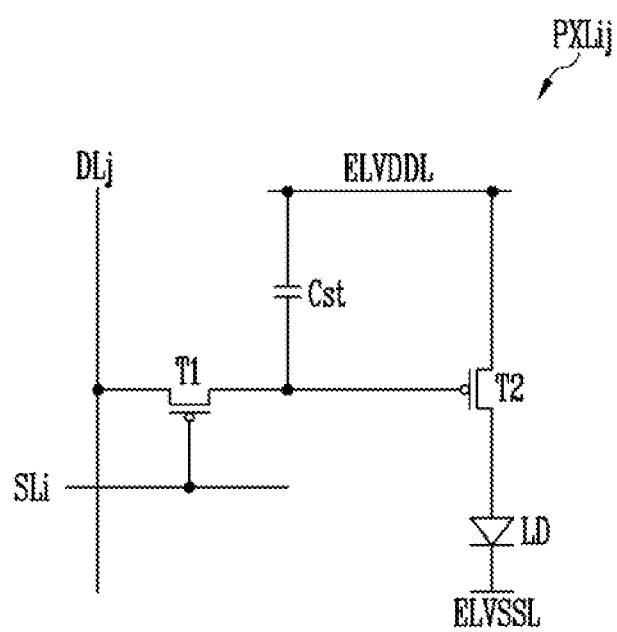
FIG. 2 illustrates a schematic view for explaining a pixel according to an embodiment of the present invention.

FIG. 2 illustrates a schematic view for explaining a pixel according to an embodiment of the present invention.

A gate electrode of a first transistor T1 may be connected to an i-th scan line SLi, a first electrode of the first transistor T1 may be connected to a j-th data line DLj, and a second electrode of the first transistor T may be connected to a second electrode of a storage capacitor Cst. The first transistor T1 may be referred to as a scan transistor.

A gate electrode of a second transistor T2 may be connected to the second electrode of the first transistor T1, a first electrode of the second transistor T2 may be connected to a first pixel power line ELVDDL, and a second electrode of the second transistor T2 may be connected to the anode of a light emitting diode LD. The second transistor T2 may be referred to as a driving transistor.

A first electrode of the storage capacitor Cst may be connected to the first pixel power line ELVDDL, and the second electrode of the storage capacitor Cst may be connected to the gate electrode of the second transistor T2. For example, the second electrode of the storage capacitor Cst may be connected to a node between the gate electrode of the second transistor T2 and the second electrode of the first transistor T1.

The anode of the light emitting diode LD may be connected to the second electrode of the second transistor T2, and a cathode of the light emitting diode LD may be connected to a second pixel power line ELVSSL. During a light emission period of the light emitting diode LD, a first pixel power voltage applied to the first pixel power line ELVDDL may be greater than a second pixel power voltage applied to the second pixel power line ELVSSL.

Here, the first and second transistors T1 and T2 are illustrated as P-type transistors, but at least one of the first and second transistors T1 and T2 may be replaced with a N-type transistor by inverting a phase of a signal.

When a scan signal having a turn-on level (e.g., a logic low level) is applied through the scan line SLi, the first transistor T1 is turned on. In this case, a data voltage applied to the data line DLj flows through the first transistor T1 and is stored in the storage capacitor Cst.

A driving current, which corresponds to a voltage difference between the first electrode and the second electrode of the storage capacitor Cst, flows between the first electrode and the second electrode of the second transistor T2. Thus, the light emitting diode LD emits light with luminance corresponding to the data voltage.

Next, when a scan signal of a turn-off level (e.g., a logic high level) is applied through the scan line SLi, the first transistor T1 is turned off, and the data line DLj and the second electrode of the storage capacitor Cst are electrically separated. Therefore, even if the data voltage of the data line DLj is changed, the voltage stored in the second electrode of the storage capacitor Cst is not changed.

The embodiments of the present invention may be applied not only to the pixel PXij of FIG. 2, but also to a pixel having another pixel circuit.

Figure 3:
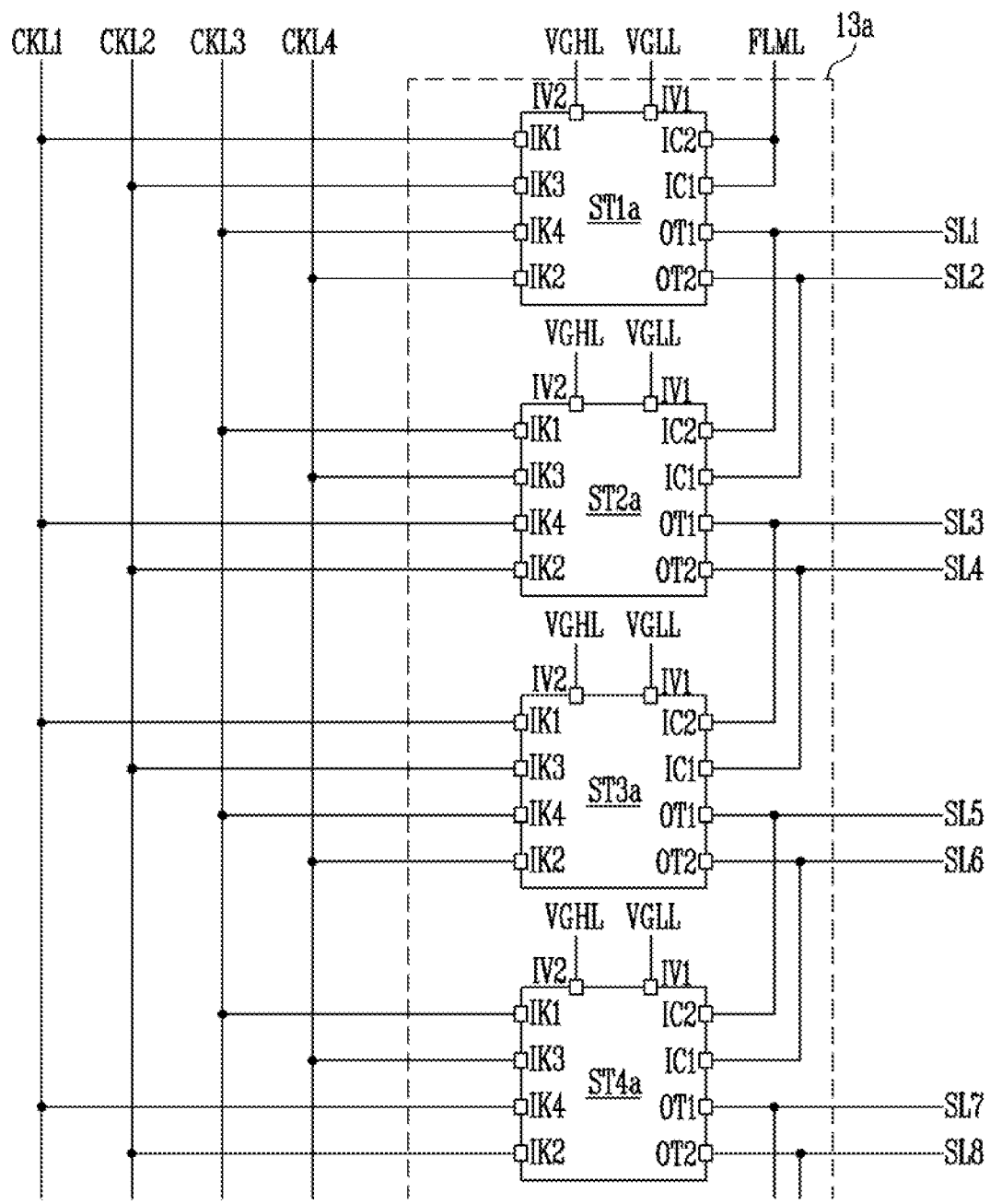
FIG. 3 illustrates a schematic view for explaining a scan driver according to an embodiment of the present invention.

FIG. 3 illustrates a schematic view for explaining a scan driver according to an embodiment of the present invention.

Referring to FIG. 3, a scan driver 13a may include a plurality of stages (ST1a, ST2a, ST3a, ST4a, . . . ).

Each of the stages (ST1a, ST2a, ST3a, ST4a, . . . ) may include a first power terminal IV1, a second power terminal IV2, a first carry terminal IC1, a second carry terminal IC2, a first clock terminal IK1, a second clock terminal IK2, a third clock terminal IK3, a fourth clock terminal IK4, a first output terminal OT1, and a second output terminal OT2.

The first power terminals IV1 of the stages (ST1a, ST2a, ST3a, ST4a, . . . ) may be connected to a first power line VGLL, and the second power terminals IV2 of the stages (ST1a, ST2a, ST3a, ST4a, . . . ) may be connected to a second power line VGHL. A second power source voltage of the second power line VGHL may be greater than a first power source voltage of the first power line VGLL.

The first carry terminals IC1 of the stages (ST1a, ST2a, ST3a, ST4a, . . . ) may be connected to the second output terminals OT2 of previous stages. In addition, the second carry terminals IC2 of the stages (ST1a, ST2a, ST3a, ST4a, . . . ) may be connected to the first output terminals OT1 of previous stages. However, the first carry terminal IC1 and the second carry terminal IC2 of the first stage ST1a may be connected to each other. For example, the first carry terminal IC1 and the second carry terminal IC2 of the first stage ST1a may be commonly connected to a scan start line FLML.

The first clock terminals IK1 of the stages (ST1a, ST2a, ST3a, ST4a, . . . ) may be alternately connected to a first clock line CKL1 or a third clock line CKL3. For example, the first clock terminals IK1 of odd-numbered stages (ST1a and ST3a) may be connected to the first clock line CKL1, and the first clock terminals IK1 of even-numbered stages (ST2a and ST4a) may be connected to the third clock line CKL3.

The second clock terminals IK2 of the stages (ST1a, ST2a, ST3a, ST4a, . . . ) may be alternately connected to a fourth clock line CKL4 or a second clock line CKL2. For example, the second clock terminals IK2 of the odd-numbered stages (ST1a and ST3a) may be connected to the fourth clock line CKL4, and the second clock terminals IK2 of even-numbered stages (ST2a and ST4a) may be connected to the second clock line CKL2.

The third clock terminals IK3 of the stages (ST1a, ST2a, ST3a, ST4a, . . . ) may be alternately connected to the second clock line CKL2 or the fourth clock line CKL4. For example, the third clock terminals IK3 of the odd-numbered stages (ST1a and ST3a) may be connected to the second clock line CKL2, and the third clock terminals IK3 of the even-numbered stages (ST2a and ST4a) may be connected to the fourth clock line CKL4.

The fourth clock terminals IK4 of the stages (ST1a, ST2a, ST3a, ST4a, . . . ) may be alternately connected to the third clock line CKL3 or the first clock line CKL1. For example, the fourth clock terminals IK4 of the odd-numbered stages (ST1a and ST3a) may be connected to the third clock line CKL3, and the fourth clock terminals IK4 of the even-numbered stages (ST2a and ST4a) may be connected to the first clock line CKL1.

The first and second output terminals OT1 and OT2 of each of the stages (ST1a, ST2a, ST3a, ST4a, . . . ) may be connected to different scan lines. For example, the first output terminals OT1 of the stages (ST1a, ST2a, ST3a, ST4a, . . . ) may be connected to odd-numbered scan lines (SL1, SL3, SL5, SL7, . . . ), and the second output terminals OT2 of the stages (ST1a, ST2a, ST3a, ST4a, . . . ) may be connected to even-numbered scan lines (SL2, SL4, SL6, SL8, . . . ).

For example, in the second stage ST2a, the first carry terminal IC1 may be connected to the second output terminal OT2 of the first stage ST1a, the second carry terminal IC2 may be connected to the first output terminal OT1 of the first stage ST1a, the first clock terminal IK1 may be connected to the fourth clock terminal IK4 of the first stage ST1a, the second clock terminal IK2 may be connected to the third clock terminal IK3 of the first stage ST1a, the third clock terminal IK3 may be connected to the second clock terminal IK2 of the first stage ST1a, and the fourth clock terminal IK4 may be connected to the first dock terminal IK1 of the first stage ST1a.

In another embodiment of the present invention, the odd-numbered configuration may be substituted with the even-numbered configuration, and the even-numbered configuration may be replaced with the odd-numbered configuration. For example, the first clock terminals IK1 of the odd-numbered scan stages ST1a and ST3a may be connected to the third clock line CKL3, and the first clock terminals IK1 of the even-numbered scan stages ST2a and ST4a may be connected to the first clock line CKL1.

Figure 4:
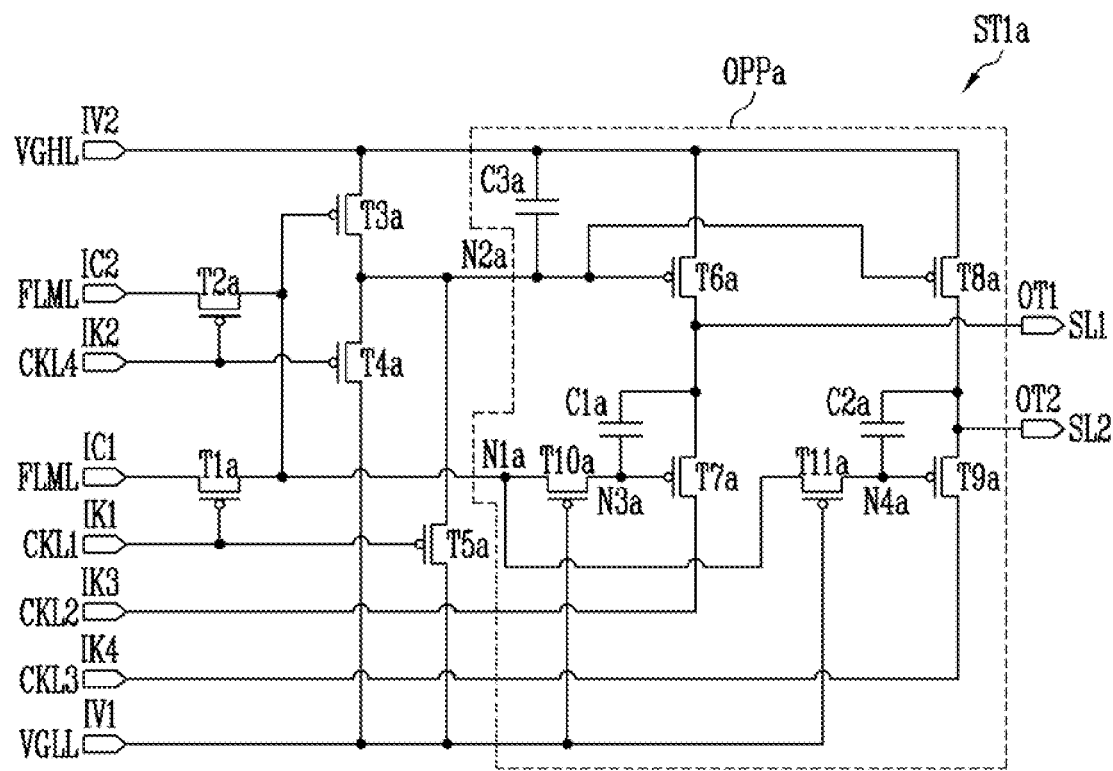
FIG. 4 illustrates a schematic view for explaining a stage according to an embodiment of the present invention.

FIG. 4 illustrates a schematic view for explaining a stage according to an embodiment of the present invention.

Referring to FIG. 4, the first stage ST1a may include a plurality of transistors T1a, T2a, T3a, T4a, T5a, T6a, T7a, T8a, T9a, T10a and T11a and a plurality of capacitors C1a, C2a and C3a. Other stages (ST2a, ST3a, ST4a, . . . ) of the scan driver 13a may also have the same or similar configuration as the first stage ST1a.

The first stage ST1a may include an output portion OPPa that outputs a first scan signal to the first output terminal OT1 and outputs a second scan signal to the second output terminal OT2, based on a voltage of a first node N1a and a voltage of a second node N2a. According to the present embodiment, the output portion OPPa may include sixth to eleventh transistors T6a to T11a and first to third capacitors C1a to C3a.

In the first transistor T1a, a gate electrode may be connected to the first clock terminal IK1, a first electrode may be connected to the first carry terminal IC1, and a second electrode may be connected to the first node N1a. The first carry terminal IC1 may be connected to the scan start line FLML. The first clock terminal IK1 may be connected to the first clock line CKL1.

In the second transistor T2a, a gate electrode may be connected to the second clock terminal IK2, a first electrode may be connected to the second carry terminal IC2, and a second electrode may be connected to the first node N1a. The second electrode of the first transistor T1a and the second electrode of the second transistor T2a may be connected to each other. The second carry terminal IC2 may be connected to the scan start line FLML. The second clock terminal IK2 may be connected to the fourth clock line CKL4.

In the third transistor T3a, a gate electrode may be connected to the first node N1a, a first electrode may be connected to the second node N2a, and a second electrode may be connected to the second power terminal IV2. In the present embodiment, a width/length ratio of a channel of the third transistor T3a may be smaller than or equal to that of the channel of the fourth transistor T4a or the fifth transistor T5a. The second power terminal IV2 may be connected to the second power line VGHL.

In the fourth transistor T4a, a gate electrode may be connected to the second clock terminal IK2, a first electrode may be connected to the first power terminal IV1, and a second electrode may be connected to the second node N2a.

The second electrode of the fourth transistor T4a may be connected to the first electrode of the third transistor T3a. The first power terminal IV1 may be connected to the first power line VGLL In the fifth transistor T5a, a gate electrode may be connected to the first clock terminal IK1, a first electrode may be connected to the first power terminal IV1, and a second electrode may be connected to the second node N2a. As shown in FIG. 4, the first to fifth transistors T1a to T5a may not be included in the output portion OPPa.

In the sixth transistor T6a, a gate electrode may be connected to the second node N2a, a first electrode may be connected to the first output terminal OT1, and a second electrode may be connected to the second power terminal IV2. The first output terminal OT1 may be connected to the first scan line SL1.

In the seventh transistor T7a, a gate electrode may be connected to a third node N3a, a first electrode may be connected to the third clock terminal IK3, and a second electrode may be connected to the first output terminal OT1. The third clock terminal IK3 may be connected to the second clock line CKL2.

In the first capacitor C1a, a first electrode may be connected to the third node N3a, and a second electrode may be connected to the first output terminal OT1. The first electrode of the first capacitor C1a may be connected to the gate electrode of the seventh transistor T7a.

In the eighth transistor T8a, a gate electrode may be connected to the second node N2a, a first electrode may be connected to the second output terminal OT2, and a second electrode may be connected to the second power terminal IV2. The gate electrode of the eighth transistor T8 may be connected to the gate electrode of the sixth transistor T6a. The second output terminal OT2 may be connected to the second scan line SL2.

In the ninth transistor T9a, a gate electrode may be connected to a fourth node N4a, a first electrode may be connected to the fourth clock terminal IK4, and a second electrode may be connected to the second output terminal OT2. The fourth clock terminal IK4 may be connected to the third clock line CKL3.

In the second capacitor C2a, a first electrode may be connected to the fourth node N4a, and a second electrode may be connected to the second output terminal OT2. The first electrode of the second capacitor C2a may be connected to the gate electrode of the ninth transistor T9a.

In the third capacitor C3a, a first electrode may be connected to the second node N2a, and a second electrode may be connected to the second power terminal IV2.

In the tenth transistor T10a, a gate electrode may be connected to the first power terminal IV1, a first electrode may be connected to the first node N1a, and a second electrode may be connected to the third node N3a.

In the eleventh transistor T11a, a gate electrode may be connected to the first power terminal IV1, a first electrode may be connected to the first node N1a, and a second electrode may be connected to the fourth node N4a. The tenth transistor T10a and the seventh transistor T7a may be referred to as a first pair of transistors with the third node N3a therebetween. The eleventh transistor T11a and the ninth transistor T9a may be referred to as a second pair of transistors with the fourth node N4a therebetween.

According to the present embodiment, since two stages may be implemented as one stage, a dead space may be reduced.

Figure 5:
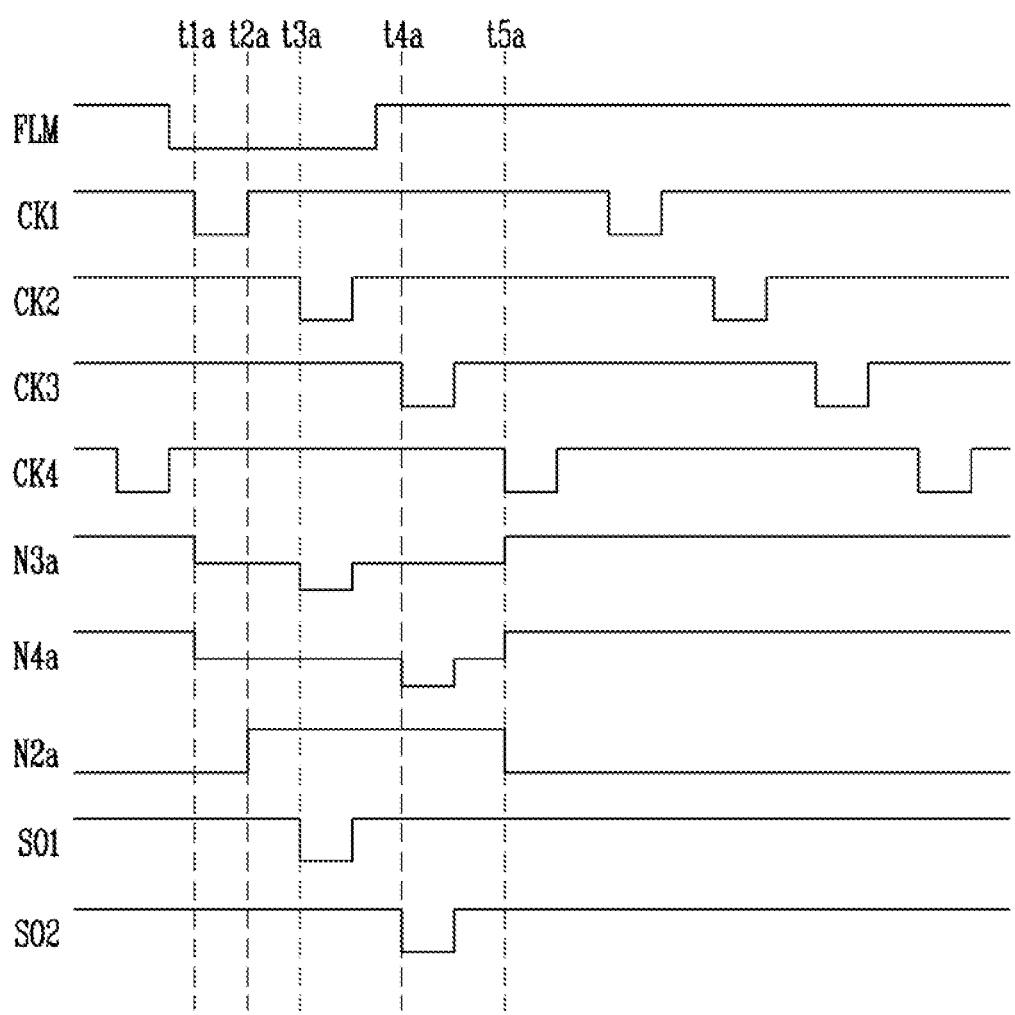
FIG. 5 illustrates a timing chart for explaining an example driving method of the stage of FIG. 4.

FIG. 5 illustrates a timing chart for explaining an example driving method of the stage of FIG. 4.

A first clock signal CK1 may be applied to first clock line CKL1, a second clock signal CK2 may be applied to the second clock line CKL2, a third clock signal CK3 may be applied to the third clock line CKL3, and a fourth clock signal CK4 may be applied to the fourth clock line CKL4. The first clock signal CK1 to the fourth clock signal CK4 may be signals having the same frequency and different phases. For example, the first clock signal CK1 of a turn-on level (logic low level), the second clock signal CK2 of a turn-on level, the third clock signal CK3 of a turn-on level, and the fourth clock signal CK4 of a turn-on level may be sequentially supplied.

First, a scan start signal FLM of a turn-on level (logic low level) may be applied to the first scan start line FLML.

As the first clock signal CK1 of the turn-on level is applied at a time point t1a, the first transistor T1a and the fifth transistor T5a are turned on. As the first transistor T1a is turned on, the first node N1a may be discharged to a logic low level. In this case, since the tenth transistor T10a is turned on, the third node N3a may be discharged to a logic low level, and the seventh transistor T7a may be turned on. In addition, since the eleventh transistor T11a is turned on, the fourth node N4a may be discharged to a logic low level, and the ninth transistor T9a may be turned on.

As the first node N1a is discharged to a logic low level, the third transistor T3a may be turned on. Accordingly, a current path connected to the second power line VGHL, the third transistor T3a, the fifth transistor T5a, and the first power line VGLL may be formed. In this case, a current flowing through this path may be set to be sufficiently small.

For example, the width/length ratio of the channel of the third transistor T3a may be smaller than or equal to that of a channel of the fifth transistor T5a. When the width/length ratio of the channel of the third transistor T3a is smaller than that of the channel of the fifth transistor T5a, since a current flowing into the second node N2a through the third transistor T3a may be smaller than a current outputted from the second node N2a through the fifth transistor T5a, the second node N2a may be maintained at a logic low level at the time point t1a. Even if the width/length ratio of the channel of the third transistor T3a is the same as that of the channel of the fifth transistor T5a, since the current flowing through the aforementioned current path is sufficiently small, power consumption may not increase and/or driving errors may not occur.

As the first dock signal CK1 of a turn-off level (logic high level) is supplied at a time point t2a, the first transistor T1a and the fifth transistor T5a may be turned off. It is to be understood that from the time point t1a to the time point t2a, the second to fourth clock signals CK2 to CK4 have the turn-off level. In this case, since the third transistor T3a is maintained at a turn-on state, the second node N2a may be charged with the second power source voltage (logic high level).

As the second clock signal CK2 of a turn-on level (logic low level) is supplied at a time point t3a, a voltage of the third node N3a coupled through the first capacitor C1a may be lower than the logic low level. For example, for a portion of the period between the time point t3a and the time point t4a, the voltage of the third node N3a may drop below the logic low level. Accordingly, a sufficiently high source-gate voltage may be applied to the seventh transistor T7a, and a first scan signal SO1 of a turn-on level (logic low level) may be outputted to the first scan line SL1. The pulse width of the first scan signal SO1 may correspond to that of the second clock signal CK2 of the turn-on level.

In this case, the tenth transistor T10a may prevent an excessively low voltage of the third node N3a from being applied to the first node N1a. Accordingly, the first node N1a may be maintained at a logic low level, and thus, it is possible to prevent stress from being applied to other transistors (e.g., T1a, T2a, T3a or T11a) connected to the first node N1a.

As the third clock signal CK3 of a turn-on level (logic low level) is supplied at a time point t4a, a voltage of the fourth node N4a coupled through the second capacitor C2a may be lower than the logic low level. For example, for a portion of the period between the time point t4a and the time point t5a, the voltage of the fourth node N4a may drop below the logic low level. Accordingly, a sufficiently high source-gate voltage may be applied to the ninth transistor T9a, and a second scan signal SO2 of a turn-on level (logic low level) may be outputted to the second scan line SL2. The pulse width of the second scan signal SO2 may correspond to that of the third clock signal CK3 of the turn-on level.

In this case, the eleventh transistor T11a may prevent an excessively low voltage of the fourth node N4e from being applied to the first node N1a. Accordingly, the first node N1a may be maintained at a logic low level, and thus, it is possible to prevent stress from being applied to other transistors connected to the first node N1a.

As the fourth clock signal CK4 of a turn-on level (logic low level) is supplied at a time point t5a, the second transistor T2a and the fourth transistor T4a may be turned on. In this case, since the scan start signal FLM is a turn-off level (logic high level), the first node N1a, the third node N3a, and the fourth node N4a may be charged to a logic high level. In addition, the second node N2a may be discharged to the first power source voltage of a logic low level through the fourth transistor T4a.

An embodiment of the present invention provides a scan driver 13 including: a plurality of stages ST1a, . . . , wherein a first stage ST1a includes: a first transistor T1a including a gate electrode connected to a first clock terminal IK1, a first electrode connected to a first carry terminal IC1, and a second electrode connected to a first node N1a; a second transistor T2a including a gate electrode connected to a second clock terminal IK2, a first electrode connected to a second carry terminal IC2, and a second electrode connected to the first node N1a; a third transistor T3a including a gate electrode connected to the first node N1a and a first electrode connected to a second node N2a; a fourth transistor N4a including a gate electrode connected to the second clock terminal IK2, a first electrode connected to a first power terminal IV1, and a second electrode connected to the second node N2a; a fifth transistor T5a including a gate electrode connected to the first clock terminal IK1, a first electrode connected to the first power terminal IV1, and a second electrode connected to the second node N2a; and an output portion OPPa configured to output a first scan signal SL1 to a first output terminal OT1 and a second scan signal SL2 to a second output terminal OT2, based on a voltage of the first node N1a and a voltage of the second node N2a.

FIG. 6 to FIG. 10 are schematic views for explaining a first frame period and a second frame period according to an embodiment of the present invention.

Figure 6:
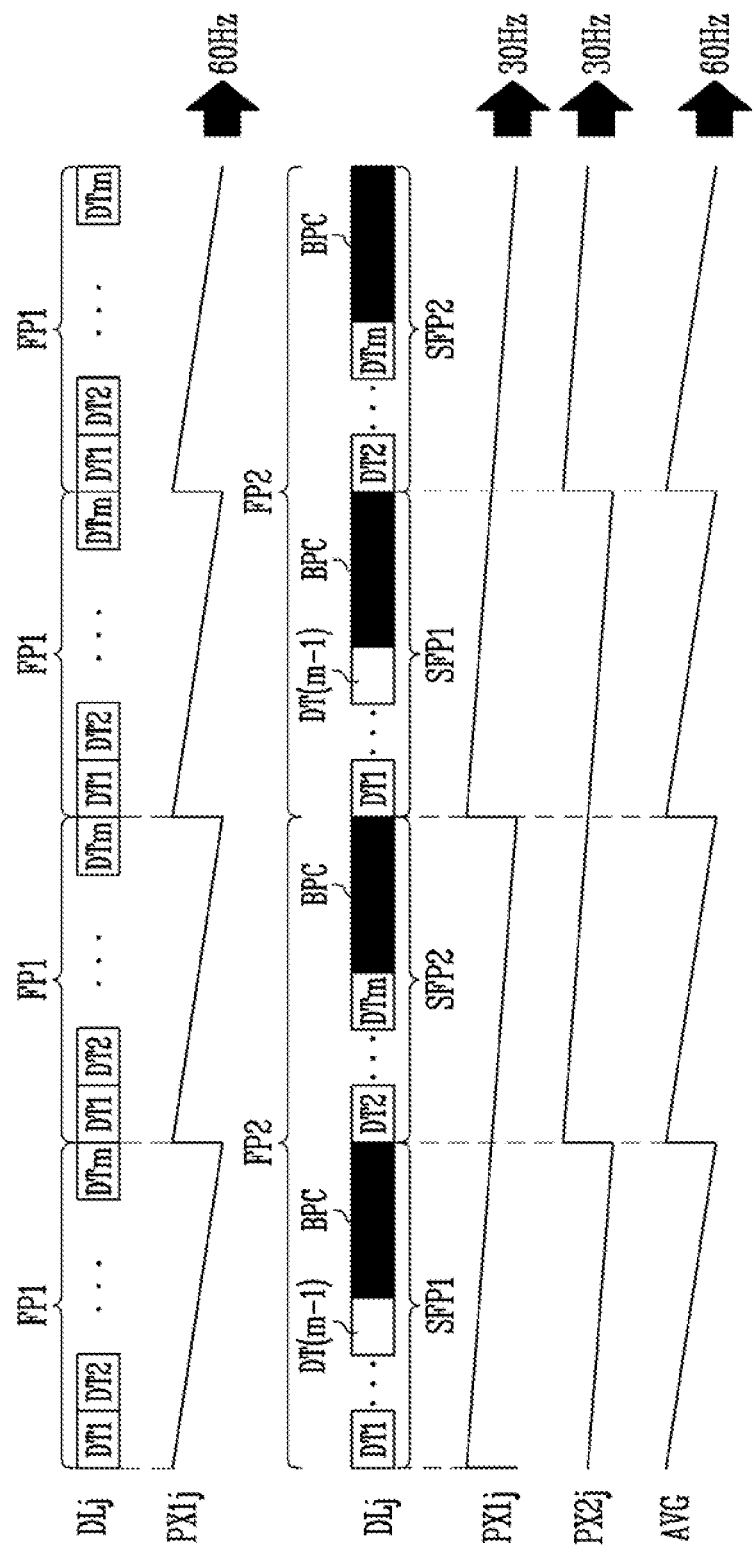
FIGS. 6, 7, 8, 9 and 10 are schematic views for explaining a first frame period and a second frame period according to an embodiment of the present invention.

The display device 10 may operate in a first display mode including a plurality of first frame periods FP1, or may operate in a second display mode including a plurality of second frame periods FP2. The second frame period FP2 may be longer than the first frame period FP1. For example, the second frame period FP2 may be an integer multiple of the first frame period FP1. For example, the second frame period FP2 may be 2p times the first frame period FP1, and p may be an integer larger than 0. In the embodiment of FIG. 6, the second frame period FP2 is twice the first frame period FP1.

The first display mode is suitable for displaying a moving picture by displaying input images (e.g., frames) at a high frequency, and the second display mode is suitable for displaying a still image by displaying the input images at a low frequency. When a still image is detected while displaying a moving picture, the display device 10 may switch from the first display mode to the second display mode. In addition, when a moving picture is detected while displaying a still image, the display device 10 may switch from the second display mode to the first display mode.

Referring to FIG. 6, for convenience of description, the j-th data line DLj and first and second pixels PX1j and PX2j will be mainly described. The first pixel PX1j may be connected to the j-th data line and the first scan line SL1. The second pixel PX2j may be connected to the j-th data line and the second scan line SL2.

In each first frame period FP1, the data driver 12 may sequentially apply data voltages corresponding to scan lines to data lines. For example, the data driver 12 may sequentially apply data voltages (DT1, DT2, . . . , DT(m−1), DTm) to the j-th data line DLj. Assuming that the first frame period FP1 is 1/60 second, the first data voltage DT1 may be supplied to the first pixel PX1j at 60 Hz. Accordingly, the first pixel PX1j emits light with a highest luminance at a time point at which the first data voltage DT1 is applied, and then, the luminance may gradually decrease due to a leakage current. Referring to FIG. 6, a luminance waveform of the first pixel PX1j corresponding to the plurality of first frame periods FP1 is illustrated as an example. This is shown by the top graph of FIG. 6.

Each second frame period FP2 may include a first sub-frame period SFP1 and a second sub-frame period SFP2. Lengths of the first sub-frame period SFP1 and the second sub-frame period SFP2 may be the same. For example, assuming that the second frame period FP2 is 1/30 second, each of the first sub-frame period SFP1 and the second sub-frame period SFP2 may be 1/60 second.

For example, in each first sub-frame period SFP1, the data driver 12 may sequentially apply data voltages corresponding to odd-numbered pixel rows to data lines. The pixel row may refer to pixels connected to the same scan line. For example, the data driver 12 may sequentially apply data voltages (DT1, DT3, . . . , DT(m−1)) to the j-th data line DLj. In each second sub-frame period SFP2, the data driver 12 may sequentially apply data voltages corresponding to even-numbered pixel rows to data lines. For example, the data driver 12 may sequentially apply data voltages (DT2, DT4, . . . , DTm) to the j-th data line DLj.

Accordingly, the first data voltage DT1 may be supplied to the first pixel PX1j at 30 Hz. Accordingly, the first pixel PX1j emits light with a highest luminance at a time point at which the first data voltage DT1 is applied, and then, its luminance may gradually decrease due to a leakage current. Referring to FIG. 6, a luminance waveform of the first pixel PX1j corresponding to the plurality of second frame periods FP2 is illustrated as an example. In addition, the second data voltage DT2 may be applied to the second pixel PX2j at 30 Hz. Accordingly, the second pixel PX2j emits light with a highest luminance at a time point at which the second data voltage DT2 is applied, and then, its luminance may gradually decrease due to a leakage current. Referring to FIG. 6, a luminance waveform of the second pixel PX2j corresponding to the plurality of second frame periods FP2 is illustrated as an example.

In this case, since the first pixel PX1j and the second pixel PX2j are positioned to be adjacent to each other, the first data voltage DT1 and the second data voltage DT2 in a typical input image may be substantially the same or similar.

Since a point of time at which the first pixel PX1j has the highest luminance and a point of time at which the second pixel PX2j has the highest luminance are alternately positioned, a user may recognize an average luminance waveform AVG of the first pixel PX1j and the second pixel PX2j as 60 Hz. For example, when the second pixel PX2j emits light with a highest luminance, the first pixel PX1j emits light with a lower luminance, and when the first pixel PXij emits light with a highest luminance, the second pixel PX2j emits light with a lower luminance. Therefore, even when the first display mode and the second display mode are switched, it is possible to prevent a flicker due to a difference in the luminance waveform from being viewed.

According to the present embodiment, each of the first sub-frame period SFP1 and the second sub-frame period SFP2 may include a data blank period BPC. The data blank period BPC may be a remaining period after the data driver 12 finishes supplying the data voltages in each of the first sub frame period SFP1 and the second sub frame period SFP2. During the data blank period BPC, all or at least a portion (e.g., a gamma amplifier or digital logic) of the data driver 12 is powered off, so that power consumption may be reduced.

Figure 7:
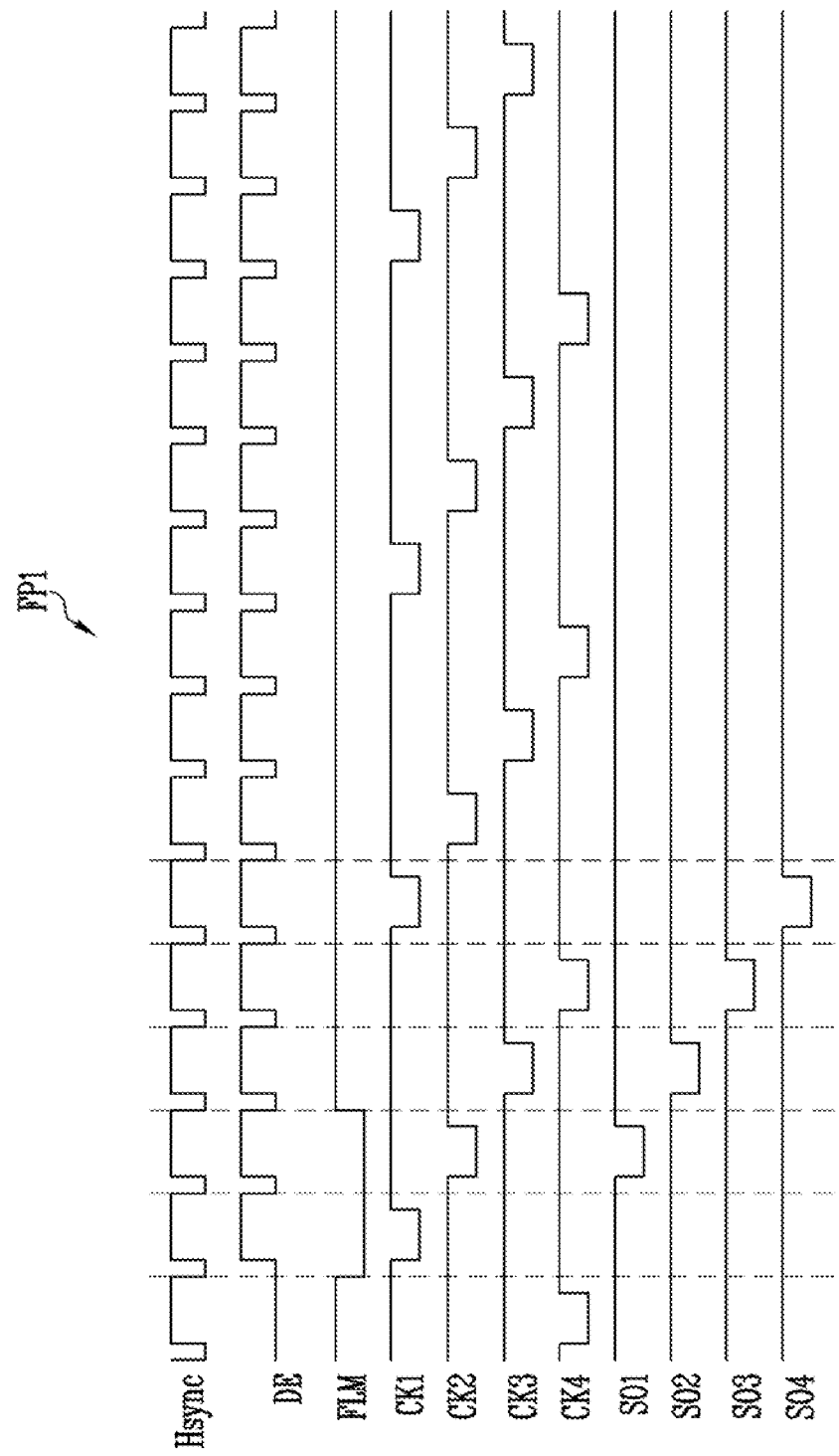

Referring to FIG. 7, control signals in the first frame period FP1 are illustrated.

During the first frame period FP1, the timing controller 11 may sequentially apply the clock signals CK1, CK2, CK3, and CK4 of a turn-on level. For example, each cycle of the clock signals CK1, CK2, CK3, and CK4 of the turn-on level may be 4 horizontal periods.

In addition, the timing controller 11 may apply the scan start signal FLM of the turn-on level to the scan start line FLML. In this case, a length of the scan start signal FLM of the turn-on level may be set to overlap the first clock signal CK1 of the turn-on level and the second clock signal CK2 of the turn-on level. For example, the length of the scan start signal FLM of the turn-on level may be 2 horizontal periods.

During the first frame period FP1, the scan driver 13 may alternately apply the scan signals (SO1, SO2, SO3, SO4, . . . ) of the turn-on level to the odd-numbered scan lines (SL1, SL3, . . . ) and the even-numbered scan lines (SL2, SL4, . . . ).

Referring to the driving method of FIG. 5, the first scan signal SO1 of the turn-on level may be generated corresponding to the second clock signal CK2 of the turn-on level. In addition, the second scan signal SO2 of the turn-on level may be generated corresponding to the third clock signal CK3 of the turn-on level. Similarly, the third scan signal SO3 of the turn-on level may be generated corresponding to the fourth clock signal CK4 of the turn-on level. In addition, the fourth scan signal SO4 of the turn-on level may be generated corresponding to the first clock signal CK1 of the turn-on level.

The data driver 12 may supply data voltages to synchronize with respective scan signals (SO1, SO2, SO3, SO4, . . . ) of the turn-on level. For example, the data driver 12 may supply the data voltages in the current horizontal period corresponding to grays latched by a data enable signal DE of the logic high level of the previous horizontal period. The logic high level of the data enable signal DE may correspond to the logic high level of the horizontal synchronization signal Hsync.

Figure 8:
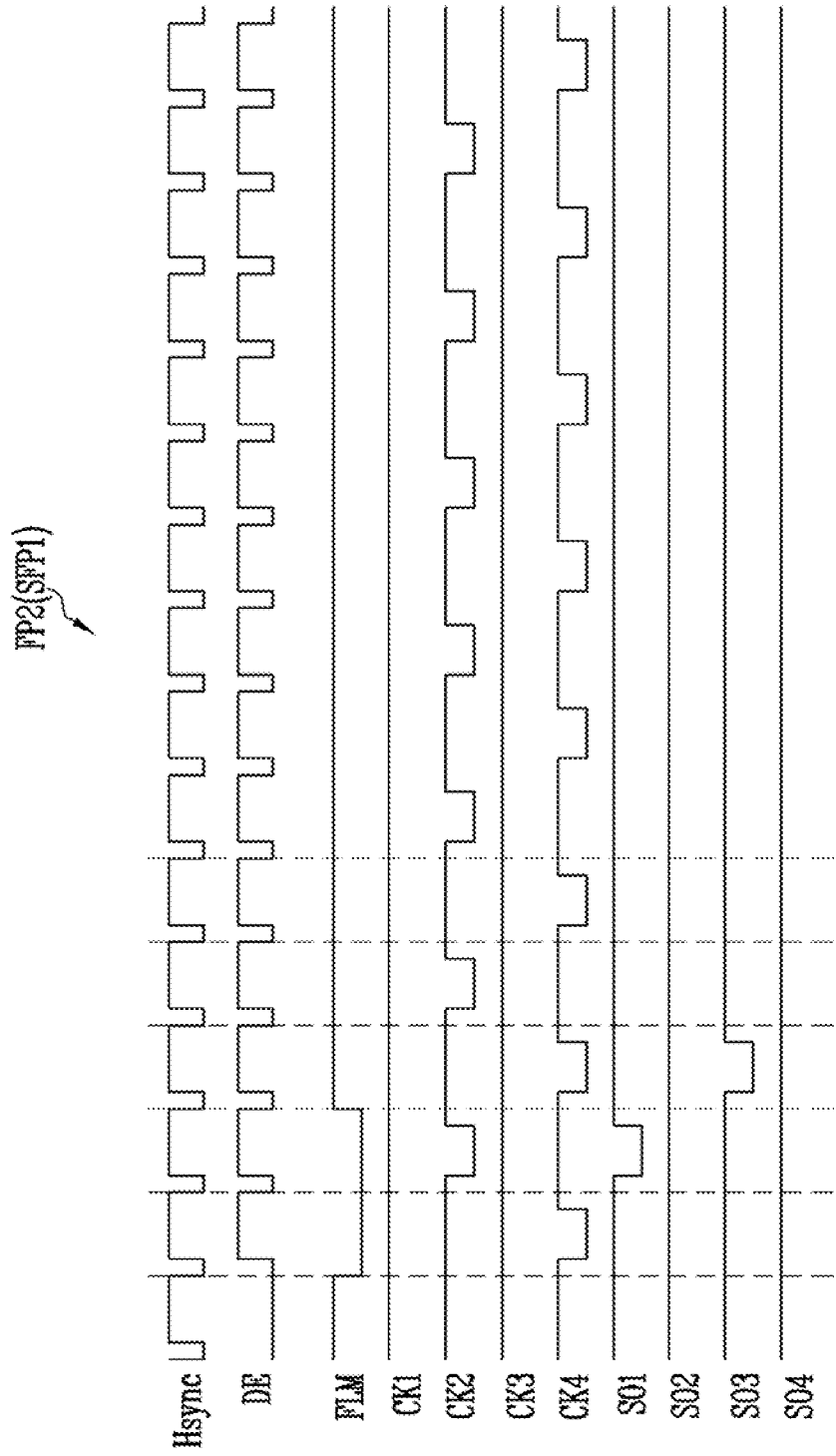

Referring to FIG. 8, control signals in the first sub-frame period SFP1 of the second frame period FP2 are shown. Specifically, FIG. 8 shows control signals in a period excluding the data blank period BPC of the first sub-frame period SFP1.

During the first sub-frame period SFP1, the timing controller 11 may maintain the first clock signal CK1 and third clock signal CK3 of the turn-off level, and may sequentially supply the fourth clock signal CK4 and the second clock signal CK2 of the turn-on level.

In the present embodiment, a cycle of applying the second and fourth clock signals CK2 and CK4 of the turn-on level to the second and fourth clock lines CKL2 and CKL4 in the first sub-frame period SFP1 may be shorter than a cycle of applying the second and fourth clock signals CK2 and CK4 of the turn-on level in the first frame period FP1. For example, each cycle of the second and fourth clock signals CK2 and CK4 of the turn-on level may be 2 horizontal periods.

During the first sub-frame period SFP1, the scan driver 13a may apply the scan signals (SO1, SO3, . . . ) of the turn-on level to the odd-numbered scan lines (SL1, SL3, . . . ), and may maintain the scan signals (SO2, SO4, . . . ) of the turn-off level to the even-numbered scan lines (SL2, SL4, . . . ). The turn-on time of the scan signals (SO1, SO3, . . . ) may correspond to the turn-on time of the second and fourth clock signals CK2 and CK4. A cycle of applying the scan signals (SO1, SO3, . . . ) of the turn-on level to the odd-numbered scan lines (SL1, SL3, . . . ) in the first sub-frame period SFP1 may be shorter than a cycle of applying the odd-numbered scan signals (SO1, SO3, . . . ) of the turn-on level in the first frame period FP1.

The data driver 12 may supply data voltages to synchronize with respective odd-numbered scan signals (SO1, SO3, . . . ) of the turn-on level.

Figure 9:
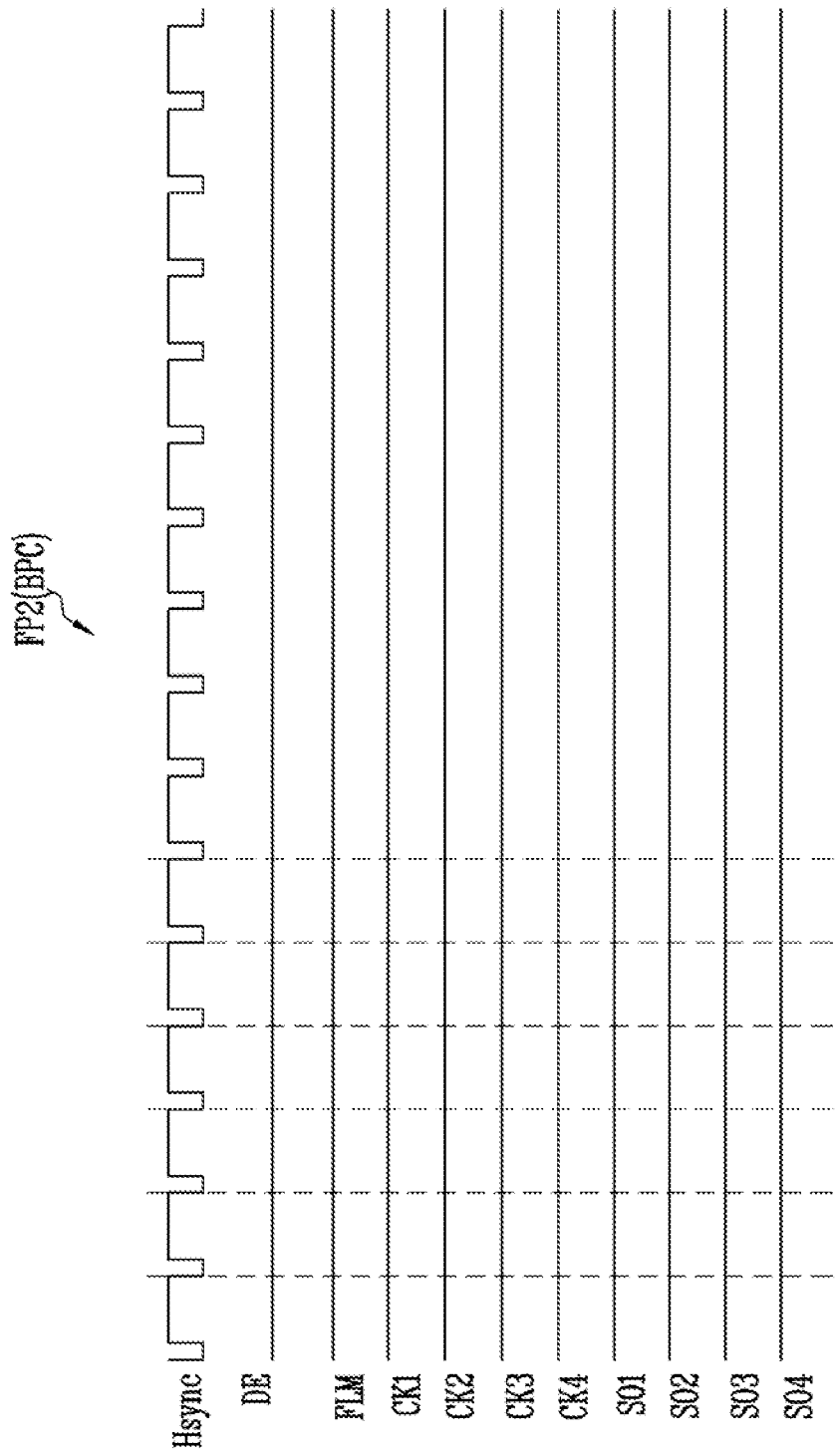

Referring to FIG. 9, control signals in the data blank period BPC of the 10 second frame period FP2 are shown. In the data blank period BPC, the clock signals CK1, CK2, CK3, and CK4 of the turn-off level, the scan signals (SO1, SO2, SO3, SO4, . . . ) of the turn-off level, and the scan start signal FLM of the turn-off level may be maintained.

As described above, during the data blank period BPC, all or at least a portion (a gamma amplifier or digital logic) of the data driver 12 is powered off, so that power consumption may be reduced.

Figure 10:
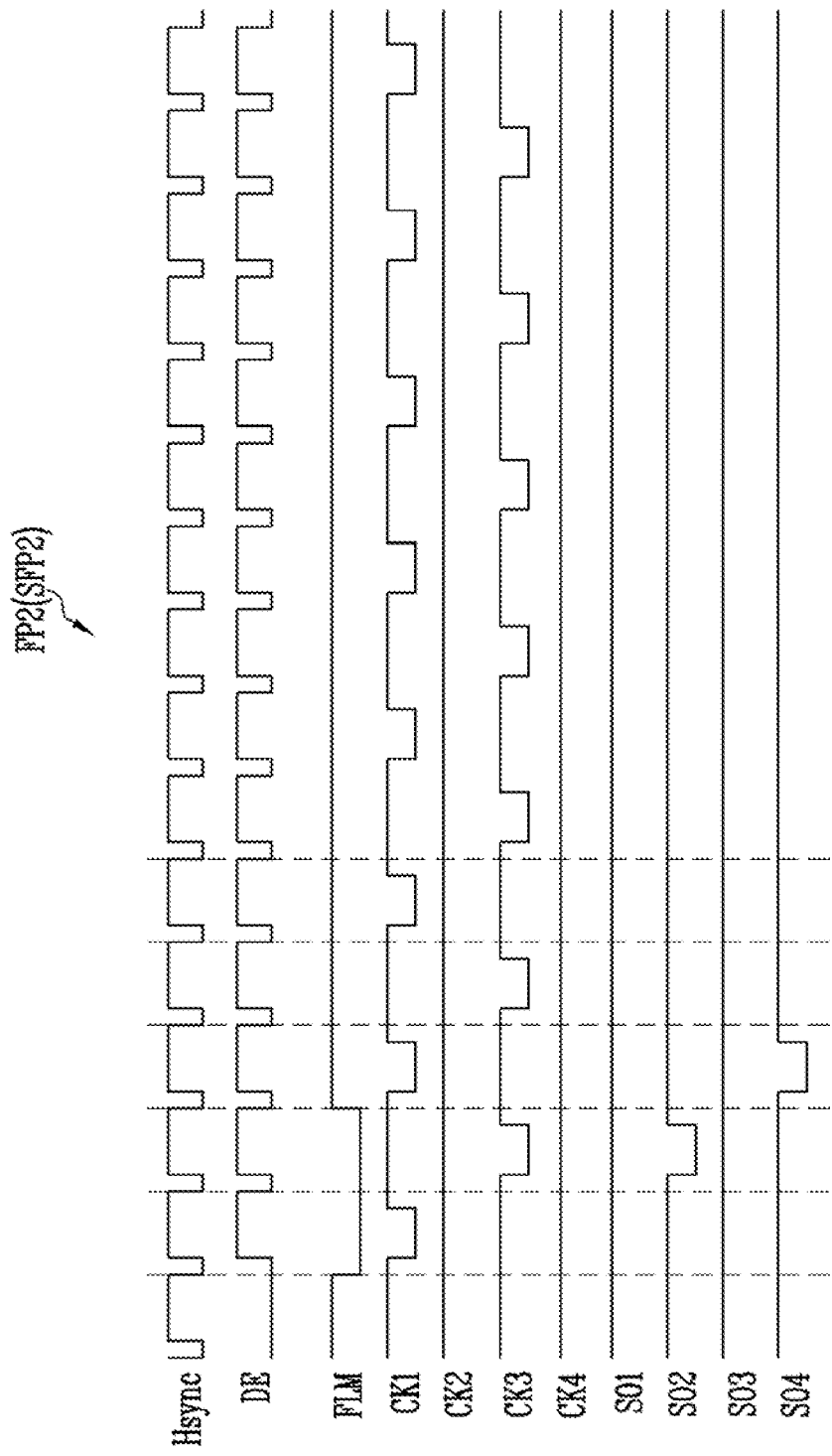

Referring to FIG. 10, control signals in the second sub-frame period SFP2 of the second frame period FP2 are shown. Specifically, FIG. 10 shows control signals in a period excluding the data blank period BPC of the second sub-frame period SFP2.

During the second sub-frame period SFP2, the timing controller 11 may maintain the second clock signal CK2 and fourth clock signal CK4 of the turn-off level, and may sequentially supply the first clock signal CK1 and the third clock signal CK3 of the turn-on level.

In the present embodiment, a cycle of applying the first and third clock signals CK1 and CK3 of the turn-on level to the first and third clock lines CKL1 and CKL3 in the second sub-frame period SFP2 may be shorter than a cycle of applying the first and third clock signals CK1 and CK3 of the turn-on level in the first frame period FP1. For example, each cycle of the first and third clock signals CK1 and CK3 of the turn-on level may be 2 horizontal periods.

During the second sub-frame period SFP2, the scan driver 13a may apply the scan signals (SO2, SO4, . . . ) of the turn-on level to the even-numbered scan lines (SL2, SL4, . . . ), and may maintain the scan signals (SO1, SO3, . . . ) of the turn-off level to the odd-numbered scan lines (SL1, SL3, . . . ). The turn-on time of the scan signals (SO2, SO4, . . . ) may correspond to the turn-on time of the first and third clock signals CK1 and CK3. A cycle of applying the scan signals (SO2, SO4, . . . ) of the turn-on level to the even-numbered scan lines (SL2, SL4, . . . ) in the second sub-frame period SFP2 may be shorter than a cycle of applying the even-numbered scan signals (SO2, SO4, . . . ) of the turn-on level in the first frame period FP1.

The data driver 12 may supply data voltages to synchronize with respective even-numbered scan signals (SO2, SO4, . . . ) of the turn-on level.

Figure 11:
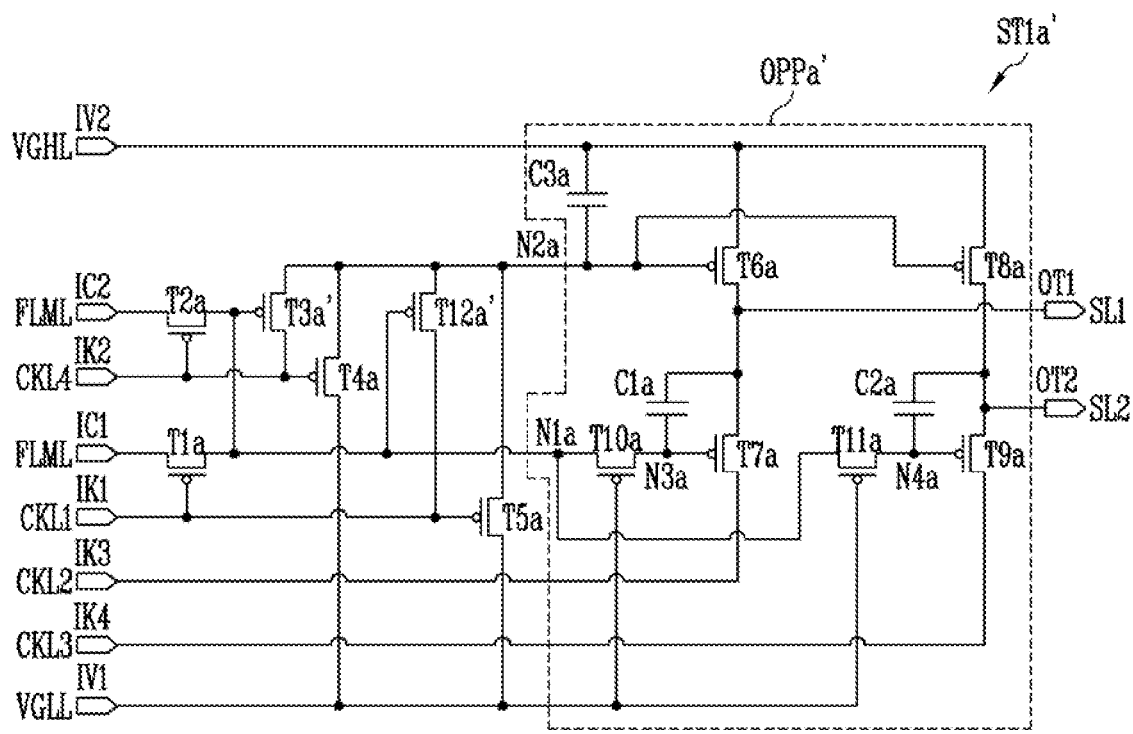
FIG. 11 illustrates a schematic view for explaining an example variation of the stage of FIG. 4.

FIG. 11 illustrates a schematic view for explaining an variation of the stage of FIG. 4.

Compared with the first stage ST1a of FIG. 4, a first stage ST1a' of FIG. 11 further includes a twelfth transistor T12a', and a connection relationship of a third transistor T3a' is different. Since other elements of the first stage ST1a' and the first stage ST1a are the same, redundant descriptions are omitted. For example, configurations of an output portion OPPa' and the output portion OPPa may be the same.

In the third transistor T3a', a gate electrode may be connected to the first node N1a, a first electrode may be connected to the second node N2a, and a second electrode may be connected to the second clock terminal IK2.

In the twelfth transistor T12a', a gate electrode may be connected to the first node N1a, a first electrode may be connected to the first clock terminal IK1, and a second electrode may be connected to the second node N2a. The gate electrode of the twelfth transistor T12a' may be connected to the gate electrode of the third transistor T3a'. In addition, the second electrode of the twelfth transistor T12a' may be connected to the first electrode of the third transistor T3a'.

The first stage ST1a' may be driven by the same method as the driving method of FIG. 5 to FIG. 10, and thus a redundant description thereof will be omitted.

Figure 12:
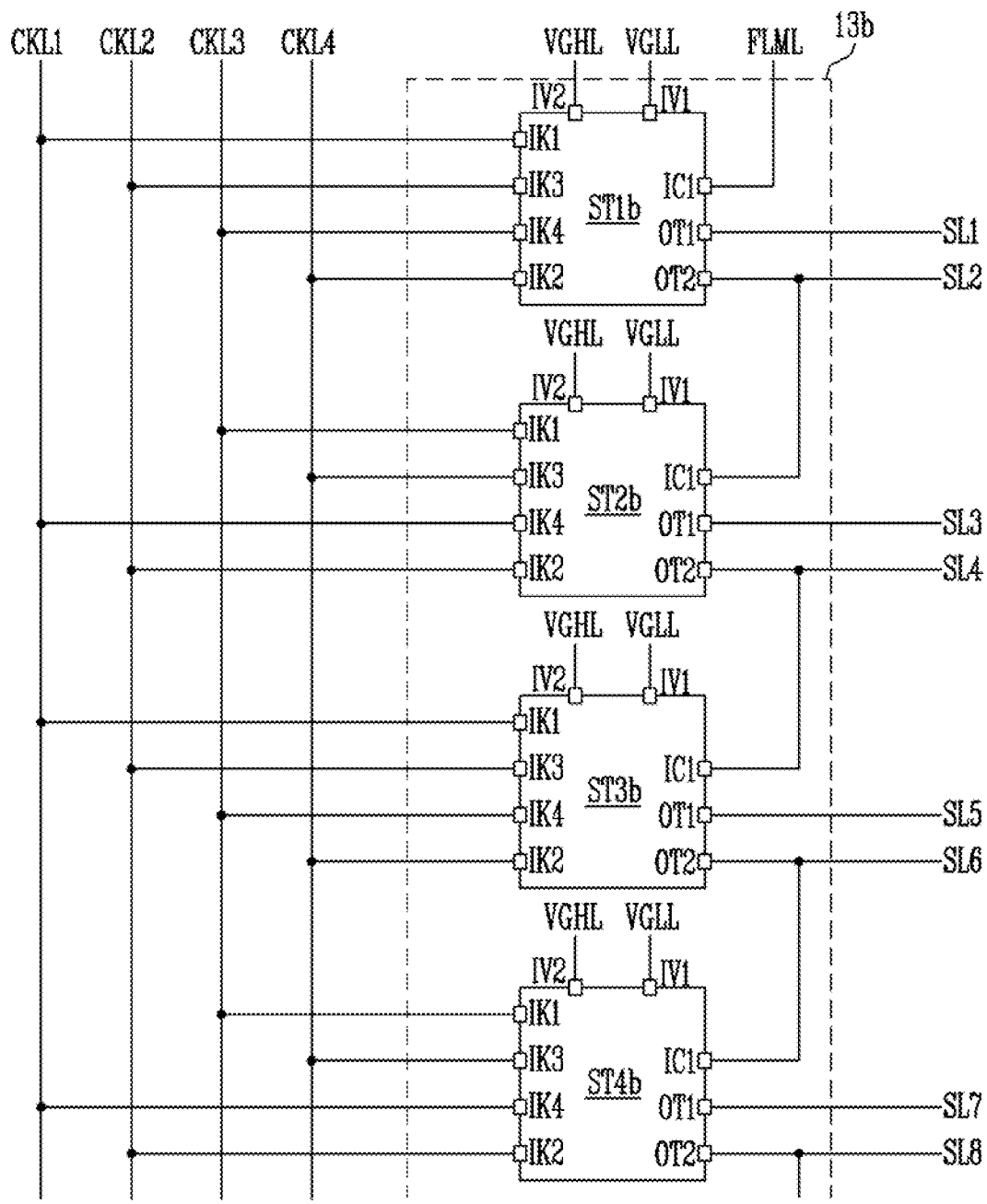
FIG. 12 illustrates a schematic view for explaining a scan driver according to another embodiment of the present invention.

FIG. 12 illustrates a schematic view for explaining a scan driver according to another embodiment of the present invention.

Compared with the scan driver 13a of FIG. 3, in a scan driver 13b of FIG. 12, each of stages (ST1b, ST2b, ST3b, ST4b, . . . ) does not include the second carry terminal IC2.

Therefore, unlike FIG. 3, a carry line used to connect the second carry terminal IC2 and the first output terminal OT1 of the previous stage is unnecessary. Accordingly, the scan driver 13b of FIG. 12 may further reduce a dead space.

Figure 13:
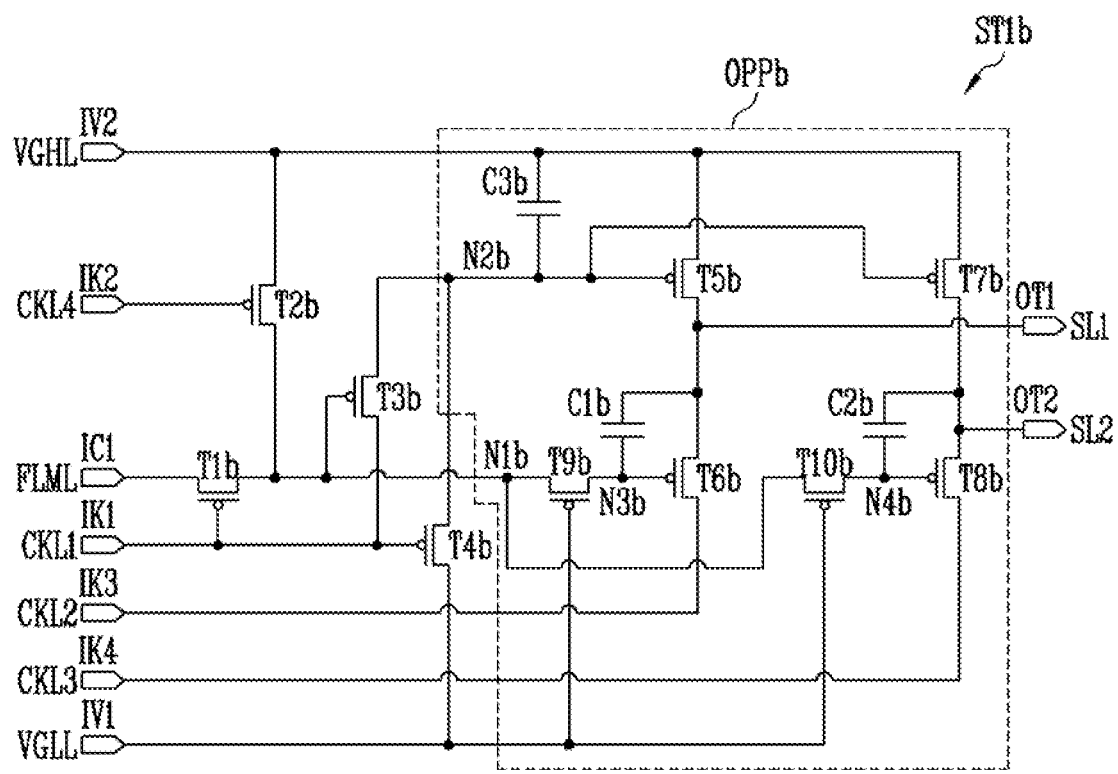
FIG. 13 illustrates a schematic view for explaining a stage according to another embodiment of the present invention.

FIG. 13 illustrates a schematic view for explaining a stage according to another embodiment of the present invention.

Referring to FIG. 13, the first stage ST1b may include a plurality of transistors T1b, T2b, T3b, T4b, T5b, T6b, T7b, T8b, T9b, and T10b and a plurality of capacitors C1b, C2b and C3b. Other stages (ST2b, ST3b, ST4b, . . . ) of the scan driver 13b may also have the same or similar configuration as the first stage ST1b.

The first stage ST1b may include an output portion OPPb that outputs a first scan signal to the first output terminal OT1 and outputs a second scan signal to the second output terminal OT2, based on a voltage of a first node N1b and a voltage of a second node N2b. In the present embodiment, the output portion OPPb may include fifth to tenth transistors T5b to T10b and first to third capacitors C1b to C3b.

In the first transistor T1b, a gate electrode may be connected to the first clock terminal IK1, a first electrode may be connected to the first carry terminal IC1, and a second electrode may be connected to the first node N1b. The first clock terminal IK1 may be connected to the first clock line CKL1.

In the second transistor T2b, a gate electrode may be connected to the second clock terminal IK2, a first electrode may be connected to the first node N1b, and a second electrode may be connected to the second power terminal IV2. The second clock terminal IK2 may be connected to the fourth clock line CKL4. The second power terminal IV2 may be connected to the second power line VGHL.

In the third transistor T3b, a gate electrode may be connected to the first node N1b, a first electrode may be connected to the first clock terminal IK1, and a second electrode may be connected to the second node N2b. The gate electrode of the third transistor T3b may be connected to the first electrode of the second transistor T2b and the second electrode of the first transistor T1b.

In the fourth transistor T4b, a gate electrode may be connected to the first clock terminal IK1, a first electrode may be connected to the first power terminal IV1, and a second electrode may be connected to the second node N2b. The first power terminal IV1 may be connected to the first power line VGLL. The first to fourth transistor T1b to T4b may not be included in the output portion OPPb.

In the fifth transistor T5b, a gate electrode may be connected to the second node N2b, a first electrode may be connected to the first output terminal OT1, and a second electrode may be connected to the second power terminal IV2. The first output terminal OT1 may be connected to the first scan line SL1.

In the sixth transistor T6b, a gate electrode may be connected to a third node N3b, a first electrode may be connected to the third clock terminal IK3, and a second electrode may be connected to the first output terminal OT1. The third clock terminal IK3 may be connected to the second clock line CKL2.

In the first capacitor C1b, a first electrode may be connected to the third node N3b, and a second electrode may be connected to the first output terminal OT1.

In the seventh transistor T7b, a gate electrode may be connected to the second node N2b, a first electrode may be connected to the second output terminal OT2, and a second electrode may be connected to the second power terminal IV2. The second output terminal OT2 may be connected to the second scan line SL2. The gate electrode of the seventh transistor T7b and the gate electrode of the fifth transistor T5b may be connected to each other.

In the eighth transistor T8b, a gate electrode may be connected to a fourth node N4b, a first electrode may be connected to the fourth clock terminal IK4, and a second electrode may be connected to the second output terminal OT2. The fourth clock terminal IK4 may be connected to the third clock line CKL3.

In the second capacitor C2b, a first electrode may be connected to the fourth node N4b, and a second electrode may be connected to the second output terminal OT2.

In the ninth transistor T9b, a gate electrode may be connected to the first power terminal IV1, a first electrode may be connected to the first node N1b, and a second electrode may be connected to the third node N3b.

In the tenth transistor T10b, a gate electrode may be connected to the first power terminal IV1, a first electrode may be connected to the first node N1b, and a second electrode may be connected to the fourth node N4b.

In the third capacitor C3b, a first electrode may be connected to the second node N2b, and a second electrode may be connected to the second power terminal IV2.

According to the present embodiment, since two stages may be implemented as one stage, a dead space may be reduced.

Figure 14:
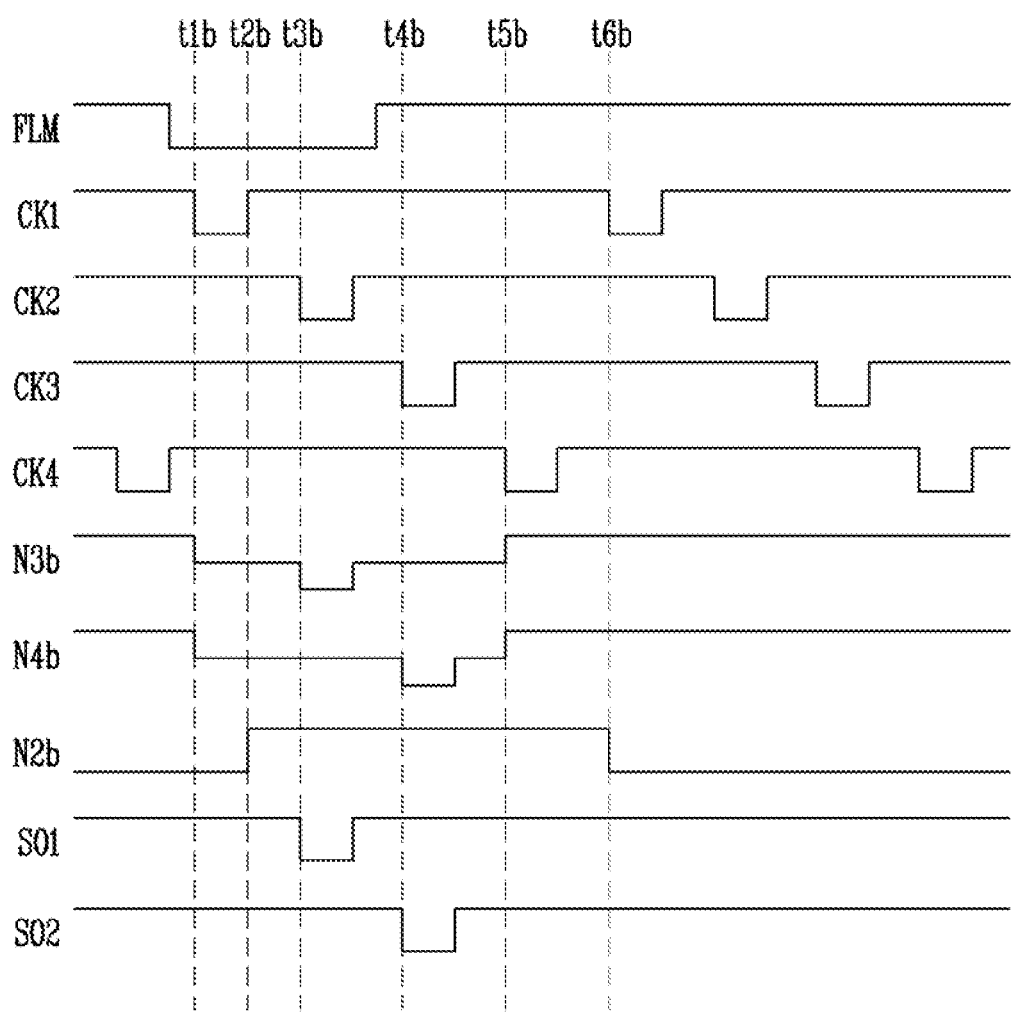
FIG. 14 illustrates a timing chart for explaining an example driving method of the stage of FIG. 13.

FIG. 14 illustrates a timing chart for explaining a driving method of the stage of FIG. 13.

The first clock signal CK1 may be applied to the first clock line CKL1, the second clock signal CK2 may be applied to the second clock line CKL2, the third clock signal CK3 may be applied to the third clock line CKL3, and the fourth clock signal CK4 may be applied to the fourth clock line CKL4. The first clock signal CK1 to fourth clock signal CK4 may be signals having the same frequency and different phases. For example, the first clock signal CK1 of the turn-on level (logic low level), the second clock signal CK2 of the turn-on level, the third clock signal CK3 of the turn-on level, and the fourth clock signal CK4 of the turn-on level may be sequentially supplied.

First, the scan start signal FLM of the turn-on level (logic low level) may be applied to the first scan start line FLML.

As the first clock signal CK1 of the turn-on level is applied at a time point t1b, the first transistor T1b and the fourth transistor T4b are turned on. As the first transistor T1b is turned on, the first node N1b may be discharged to a logic low level. In this case, since the ninth transistor T9b is turned on, the third node N3b may be discharged to a logic low level, and the sixth transistor T6b may be turned on. In addition, since the tenth transistor T10b is turned on, the fourth node N4b may be discharged to a logic low level, and the eighth transistor T8b may be turned on. In addition, as the first node N1b is discharged to a logic low level, the third transistor T3b may be turned on.

Since the first clock signal CK1 of the turn-off level (logic high level) is supplied at a time point t2b, the first transistor T1b and the fourth transistor T4b may be turned off. In this case, since the third transistor T3b is maintained at a turn-on state, the second node N2b may be charged at the logic high level.

As the second clock signal CK2 of the turn-on level (logic low level) is supplied at a time point t3b, a voltage of the third node N3b coupled through the first capacitor C1b may be lower than the logic low level. For example, for a first portion of the time between the time point t3b and a time point t4b, the voltage of the third node N3b may be lower than the logic low level, for a second portion of the time between the time point t3b and the time point t4b, the voltage of the third node N3b may be maintained at the logic low level. Accordingly, a sufficiently high source-gate voltage may be applied to the sixth transistor T6b, and a first scan signal SO1 of the turn-on level (logic low level) may be outputted to the first scan line SL1.

In this case, the ninth transistor T9b may prevent an excessively low voltage of the third node N3b from being applied to the first node N1b. Accordingly, the first node N1b may be maintained at the logic low level, and thus, it is possible to prevent stress from being applied to other transistors connected to the first node N1b.

Since the third clock signal CK3 of the turn-on level (logic low level) is supplied at a time point t4b, a voltage of the fourth node N4b coupled through the second capacitor C2b may be lower than the logic low level. For example, for a first portion of the time between the time point t4b and a time point t5b, the voltage of the fourth node N4b may be lower than the logic low level, for a second portion of the time between the time point t4b and the time point t5b, the voltage of the fourth node N3b may be maintained at the logic low level. Accordingly, a sufficiently high source-gate voltage may be applied to the eighth transistor T8b, and a second scan signal SO2 of the turn-on level (logic low level) may be outputted to the second scan line SL2.

In this case, the tenth transistor T10b may prevent an excessively low voltage of the fourth node N4b from being applied to the first node N1b. Accordingly, the first node N1b may be maintained at a logic low level, and thus, it is possible to prevent stress from being applied to other transistors connected to the first node N1b.

As the fourth clock signal CK4 of the turn-on level (logic low level) is supplied at a time point t5b, the second transistor T2b may be turned on. Accordingly, the first node N1b, the third node N3b, and the fourth node N4b may be charged to the logic high level of the second power source voltage.

As the fourth clock signal CK4 of the turn-on level (logic low level) is supplied at the time point t6b, the second transistor T4b may be turned on. Thus, the second node N2b may be discharged to the first power source voltage of the logic low level through the fourth transistor T4b.

Figure 15:
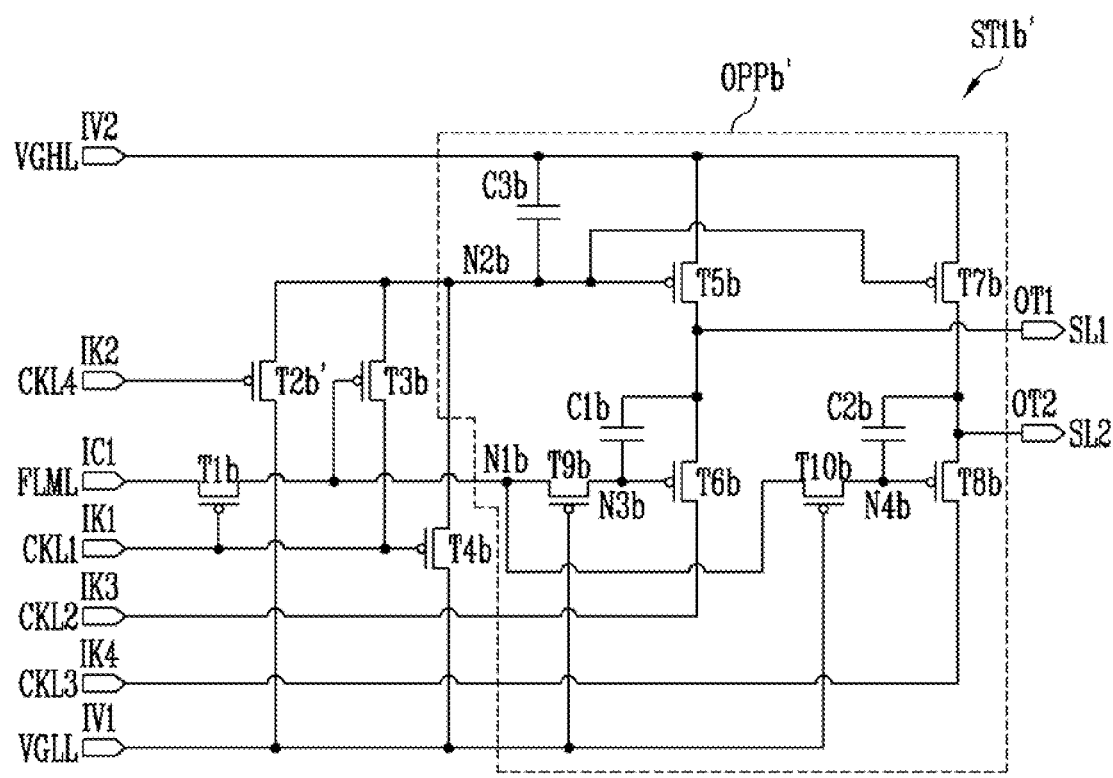
FIG. 15 illustrates a schematic view for explaining an example variation of the stage of FIG. 13.

FIG. 15 illustrates a schematic view for explaining an example variation of the stage of FIG. 13.

Compared with the first stage ST1b of FIG. 13, a first stage ST1b' of FIG. 15 has a different connection relationship of a second transistor T2b'. Since other elements of the first stage ST1b' and the first stage ST1b are the same, redundant descriptions are omitted. For example, an output portion OPPb' may have the same configuration as the output portion OPPb.

In the second transistor T2b', a gate electrode may be connected to the second clock terminal IK2, a first electrode may be connected to the first power terminal IV1, and a second electrode may be connected to the second node N2b.

Figure 16:
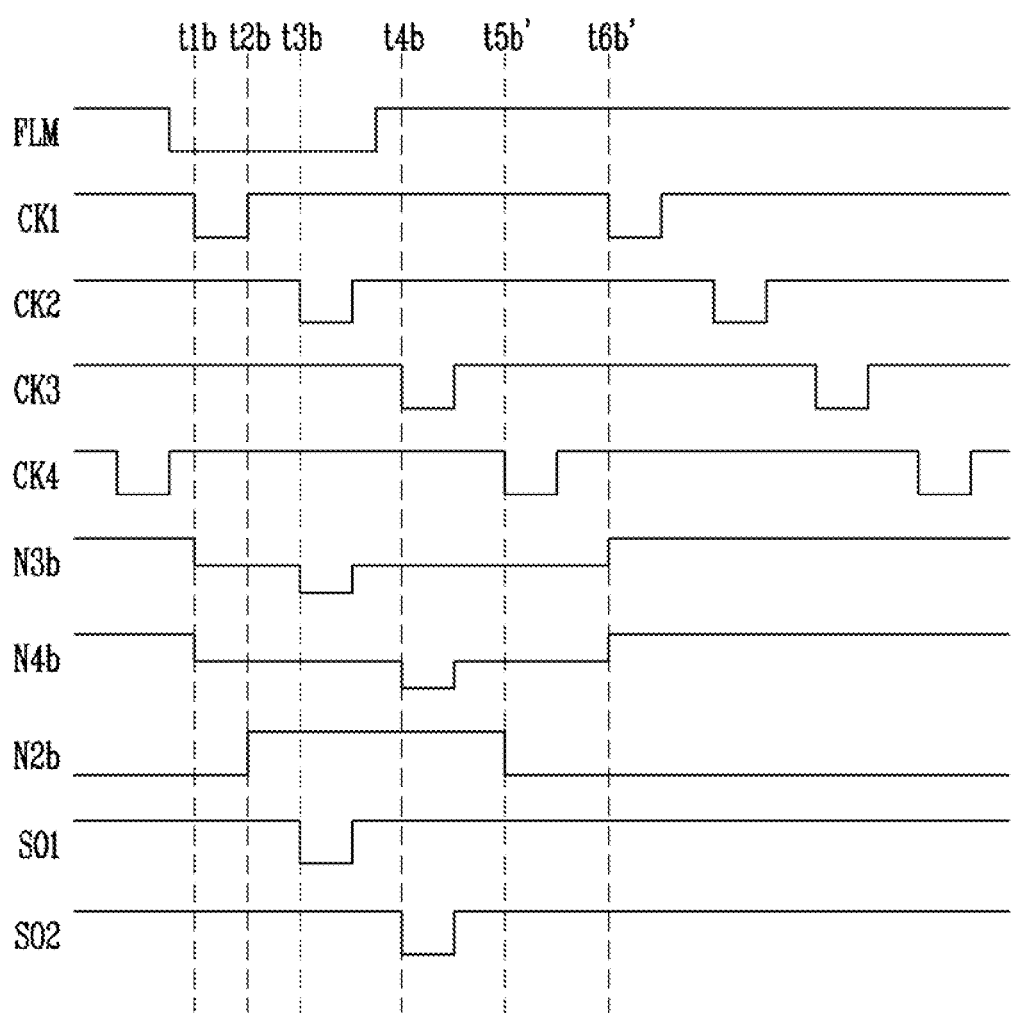
FIG. 16 illustrates a timing chart for explaining an example driving method of the stage of FIG. 15.

FIG. 16 illustrates a timing chart for explaining a driving method of the stage of FIG. 15.

Since the driving method up to the time point t4b of FIG. 16 is substantially the same as the driving method up to the time point t4b of FIG. 14, duplicate descriptions are omitted.

As the fourth clock signal CK4 of the turn-on level (logic low level) is supplied at the time point t5b, the second transistor T2b' may be turned on. Thus, the second node N2b may be discharged to the first power source voltage of the logic low level through the second transistor T2b'. In other words, at the time point t5b, the second node N2b may have the logic low level.

As the first clock signal CK1 of the turn-on level is supplied at a time point t6b', the first transistor T1b may be turned on. Accordingly, the first node N1b, the third node N3b, and the fourth node N4b may be charged to the logic high level of the scan start signal FLM. In other words, each of the first node N1b, the third node N3b and the fourth node N4b may have the logic high level.

While this invention has been described in connection with embodiments thereof, it is to be understood that the invention is not limited to the disclosed embodiments, but, various change and modifications can be made by those skilled in the art.

What is claimed is:

1. A scan driver comprising:
    a plurality of stages,
    wherein a first stage of the plurality of stages includes:
    a first transistor including a gate electrode connected to a first clock terminal, a first electrode connected to a first carry terminal, and a second electrode connected to a first node;

a second transistor including a gate electrode connected to a second clock terminal, a first electrode connected to a second carry terminal, and a second electrode connected to the first node;

a third transistor including a gate electrode connected to the first node and a first electrode connected to a second node;

a fourth transistor including a gate electrode connected to the second clock terminal, a first electrode connected to a first power terminal, and a second electrode connected to the second node;

a fifth transistor including a gate electrode connected to the first clock terminal, a first electrode connected to the first power terminal, and a second electrode connected to the second node; and a output portion configured to output a first scan signal to a first output terminal and a second scan signal to a second output terminal, based on a voltage of the first node and a voltage of the second node.

2. The scan driver of claim 1, wherein
the output portion includes:
a sixth transistor including a gate electrode connected to the second node, a first electrode connected to the first output terminal, and a second electrode connected to a second power terminal;
a seventh transistor including a gate electrode connected to a third node, a first electrode connected to a third clock terminal, and a second electrode connected to the first output terminal; and
a first capacitor including a first electrode connected to the third node and a second electrode connected to the first output terminal.

3. The scan driver of claim 2, wherein
the output portion further includes:
an eighth transistor including a gate electrode connected to the second node, a first electrode connected to the second output terminal, and a second electrode connected to the second power terminal;
a ninth transistor including a gate electrode connected to a fourth node, a first electrode connected to a fourth clock terminal, and a second electrode connected to the second output terminal; and
a second capacitor including a first electrode connected to the fourth node and a second electrode connected to the second output terminal.

4. The scan driver of claim 3, wherein
the output portion further includes:
a third capacitor including a first electrode connected to the second node and a second electrode connected to the second power terminal;
a tenth transistor including a gate electrode connected to the first power terminal, a first electrode connected to the first node, and a second electrode connected to the third node; and
an eleventh transistor including a gate electrode connected to the first power terminal, a first electrode connected to the first node, and a second electrode connected to the fourth node.

5. The scan driver of claim 4, wherein
the second electrode of the third transistor is connected to the second power terminal.

6. The scan driver of claim 4, wherein
the second electrode of the third transistor is connected to the second clock terminal.

7. The scan driver of claim 6, wherein
the first stage further includes a twelfth transistor including a gate electrode connected to the first node, a first electrode connected to the first clock terminal, and a second electrode connected to the second node.

8. The scan driver of claim 4, wherein
in a second stage of the plurality of stages, a first carry terminal is connected to the second output terminal of the first stage, a second carry terminal is connected to the first output terminal of the first stage, a first clock terminal is connected to the fourth clock terminal of the first stage, a second clock terminal is connected to the third clock terminal of the first stage, a third clock terminal is connected to the second clock terminal of the first stage, and a fourth clock terminal is connected to the first clock terminal of the first stage.

9. The scan driver of claim 8, wherein
the first carry terminal and the second carry terminal of the first stage are connected to each other.

10. The scan driver of claim 1, wherein
a width/length ratio of a channel of the third transistor is less than or equal to a width/length ratio of a channel of the fourth transistor or the fifth transistor.

11. A scan driver comprising:
a plurality of stages,
wherein a first stage of the plurality of stages includes:
a first transistor including a gate electrode connected to a first clock terminal, a first electrode connected to a first carry terminal, and a second electrode connected to a first node;
a second transistor including a gate electrode connected to a second clock terminal, a first electrode connected to the first node, and a second electrode directly connected to a second power terminal;
a third transistor including a gate electrode connected to the first node, a first electrode connected to the first clock terminal, and a second electrode connected to a second node;
a fourth transistor including a gate electrode connected to the first clock terminal, a first electrode connected to a first power terminal, and a second electrode connected to the second node; and
an output portion configured to output a first scan signal to a first output terminal and a second scan signal to a second output terminal, based on a voltage of the first node and a voltage of the second node.

12. The scan driver of claim 11, wherein
the output portion includes:
a fifth transistor including a gate electrode connected to the second node, a first electrode connected to the first output terminal, and a second electrode connected to the second power terminal;
a sixth transistor including a gate electrode connected to a third node, a first electrode connected to a third clock terminal, and a second electrode connected to the first output terminal; and
a first capacitor including a first electrode connected to the third node and a second electrode connected to the first output terminal.

13. The scan driver of claim 12, wherein
the output portion further includes:
a seventh transistor including a gate electrode connected to the second node, a first electrode connected to the second output terminal, and a second electrode connected to the second power terminal;
an eighth transistor including a gate electrode connected to a fourth node, a first electrode connected to a fourth clock terminal, and a second electrode connected to the second output terminal; and a second capacitor including a first electrode connected to the fourth node and a second electrode connected to the second output terminal.

14. The scan driver of claim 13, wherein the output portion further includes:
a ninth transistor including a gate electrode connected to the first power terminal, a first electrode connected to the first node, and a second electrode connected to the third node;
a tenth transistor including a gate electrode connected to the first power terminal, a first electrode connected to the first node, and a second electrode connected to the fourth node; and
a third capacitor including a first electrode connected to the second node and a second electrode connected to the second power terminal.

15. The scan driver of claim 14, wherein in a second stage of the plurality of stages, a first carry terminal is connected to the second output terminal of the first stage, a first clock terminal is connected to the fourth clock terminal of the first stage, a second clock terminal is connected to the third clock terminal of the first stage, a third clock terminal is connected to the second clock terminal of the first stage, and a fourth clock terminal is connected to the first clock terminal of the first stage.

16. A scan driver comprising:
a plurality of stages,
wherein a first stage of the plurality of stages includes:
a first transistor including a gate electrode connected to a first clock terminal, a first electrode connected to a first carry terminal, and a second electrode connected to a first node;
a second transistor including a gate electrode connected to a second clock terminal, a first electrode connected to a first power terminal, and a second electrode connected to a second node;
a third transistor including a gate electrode connected to the first node, a first electrode connected to the first clock terminal, and a second electrode connected to the second node;
a fourth transistor including a gate electrode connected to the first clock terminal, a first electrode connected to the first power terminal, and a second electrode connected to the second node; and
an output portion configured to output a first scan signal to a first output terminal and a second scan signal to a second output terminal, based on a voltage of the first node and a voltage of the second node.

17. The scan driver of claim 16, wherein the output portion includes:
a fifth transistor including a gate electrode connected to the second node, a first electrode connected to the first output terminal, and a second electrode connected to a second power terminal;

a sixth transistor including a gate electrode connected to a third node, a first electrode connected to a third clock terminal, and a second electrode connected to the first output terminal; and
a first capacitor including a first electrode connected to the third node and a second electrode connected to the first output terminal.

18. The scan driver of claim 17, wherein the output portion further includes:
a seventh transistor including a gate electrode connected to the second node, a first electrode connected to the second output terminal, and a second electrode connected to the second power terminal;
an eighth transistor including a gate electrode connected to a fourth node, a first electrode connected to a fourth clock terminal, and a second electrode connected to the second output terminal; and
a second capacitor including a first electrode connected to the fourth node and a second electrode connected to the second output terminal.

19. The scan driver of claim 18, wherein the output portion further includes:
a ninth transistor including a gate electrode connected to the first power terminal, a first electrode connected to the first node, and a second electrode connected to the third node;
a tenth transistor including a gate electrode connected to the first power terminal, a first electrode connected to the first node, and a second electrode connected to the fourth node; and
a third capacitor including a first electrode connected to the second node and a second electrode connected to the second power terminal.

20. A stage for a scan driver comprising:
a first transistor and a fifth transistor that are turned on by a first clock signal, wherein the first transistor is connected to a first node and the fifth transistor is connected to a second node;
a second transistor and a fourth transistor that are turned on by a second clock signal, wherein the second transistor is connected to the first node and the fourth transistor is connected to the second node and the second clock signal is directly provided to the second transistor and the fourth transistor;
a third transistor connected to the first node and the second node; and
an output circuit configured to output a first scan signal to a first output terminal and a second scan signal to a second output terminal, based on a voltage of the first node and a voltage of the second node.

* * * * *